(12) United States Patent
Lee et al.

(10) Patent No.: US 11,894,041 B2
(45) Date of Patent: Feb. 6, 2024

(54) ELECTRONIC DEVICES EXECUTING REFRESH OPERATION BASED ON ADJUSTED INTERNAL VOLTAGE

(71) Applicant: SK hynix Inc., Icheon-si Gyeonggi-do (KR)

(72) Inventors: Se Won Lee, Icheon-si Gyeonggi-do (KR); Tae Kyun Shin, Icheon-si Gyeonggi-do (KR); Jun Sang Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/676,644

(22) Filed: Feb. 21, 2022

(65) Prior Publication Data

US 2022/0172772 A1 Jun. 2, 2022

Related U.S. Application Data

(63) Continuation-in-part of application No. 17/210,009, filed on Mar. 23, 2021, now Pat. No. 11,615,832.

(30) Foreign Application Priority Data

Dec. 1, 2020 (KR) .......... 10-2020-0166090

(51) Int. Cl.
*G11C 11/406* (2006.01)
*G11C 11/4074* (2006.01)

(52) U.S. Cl.
CPC .... *G11C 11/40615* (2013.01); *G11C 11/4074* (2013.01); *G11C 11/40622* (2013.01); *G11C 11/40626* (2013.01)

(58) Field of Classification Search
CPC ........ G11C 11/40615; G11C 11/40622; G11C 11/40626; G11C 11/4074; G11C 11/4076; G11C 11/4078; G11C 7/04; G11C 7/1018
See application file for complete search history.

(56) References Cited

U.S. PATENT DOCUMENTS

| 6,990,031 | B2 | 1/2006 | Hashimoto et al. |
| 9,147,461 | B1* | 9/2015 | Youn .................. G11C 11/4076 |
| 2004/0057267 | A1 | 3/2004 | Fujioka |
| 2004/0228183 | A1* | 11/2004 | Ito .......................... G11C 11/406 365/200 |

(Continued)

FOREIGN PATENT DOCUMENTS

| KR | 1020140116650 A | 10/2014 |
| KR | 1020170130685 A | 11/2017 |

*Primary Examiner* — Sultana Begum
(74) *Attorney, Agent, or Firm* — William Park & Associates Ltd.

(57) ABSTRACT

An electronic device includes an internal mode control circuit suitable for generating a burst control signal, a blocking control signal and an internal voltage control signal based on a refresh cycle when an internal mode is performed in a self-refresh operation, a refresh control circuit suitable for generating a refresh signal for performing a refresh operation every refresh cycle when the self-refresh operation is performed, generating the refresh signal every set cycle based on the burst control signal when the internal mode is performed, and blocking the generation of the refresh signal based on the blocking control signal, and an internal voltage generation circuit suitable for adjusting a level of an internal voltage for the refresh operation based on the internal voltage control signal.

19 Claims, 24 Drawing Sheets

(56) References Cited

U.S. PATENT DOCUMENTS

| | | | |
|---|---|---|---|
| 2005/0007851 A1* | 1/2005 | Takahashi | G11C 11/4072 365/222 |
| 2005/0141310 A1* | 6/2005 | Lee | G11C 11/406 365/222 |
| 2005/0146965 A1 | 7/2005 | Kim et al. | |
| 2010/0141332 A1 | 6/2010 | Byeon | |

* cited by examiner

FIG. 3

| OPERATION | CLK EDGE | CS | CA<1> | CA<2> | CA<3> | CA<4> | CA<5> | CA<6> | CA<7> |
|---|---|---|---|---|---|---|---|---|---|
| SELF REFRESH | RISING | H | L | L | L | H | L | H | H |
| | FALLING | X | X | X | X | X | X | DSM | PDE |

FIG. 11

| CTRL_VINT | TEMP RANGE | VINT |
|---|---|---|
| H | FIRST TEMP RANGE | FIRST LEVEL |
|   | SECOND TEMP RANGE | |
| L | FIRST TEMP RANGE | SECOND LEVEL |
|   | SECOND TEMP RANGE | |

ELECTRONIC DEVICES EXECUTING REFRESH OPERATION BASED ON ADJUSTED INTERNAL VOLTAGE

CROSS-REFERENCE TO RELATED APPLICATIONS

This application is a continuation-in-part of U.S. patent application Ser. No. 17/210,009, filed on Mar. 23, 2021, which claims priority to Korean Application No. 10-2020-0166090, filed on Dec. 1, 2020. The disclosures of all of the above applications are incorporated herein by reference in their entirety.

BACKGROUND

1. Technical Field

Embodiments of the disclosed technology relate to electronic devices executing a refresh operation.

2. Related Art

Dynamic random access memory (DRAM) devices corresponding to volatile memory devices among semiconductor devices are designed to periodically perform a refresh operation to restore data in memory cells after storing the data in the memory cells to prevent the data that is stored in the memory cells from being lost. The DRAM devices may automatically and internally generate a command to perform the refresh operation to periodically perform a self-refresh operation.

Meanwhile, the semiconductor devices may activate a word line selected based on a logic level combination of addresses to perform an active operation of detecting and amplifying levels of data loaded on a bit line. When the semiconductor device repeatedly performs an active operation on a specific word line, the active operation may cause a row hammer phenomenon in which the reliability of data stored in memory cells coupled to another word line adjacent to the specific word line is deteriorated.

SUMMARY

The present disclosure provides an electronic device, including an internal mode control circuit suitable for generating a burst control signal, a blocking control signal, and an internal voltage control signal based on a refresh cycle when an internal mode is performed in a self-refresh operation, a refresh control circuit suitable for generating a refresh signal for performing a refresh operation every refresh cycle when the self-refresh operation is performed, generating the refresh signal every set cycle based on the burst control signal when the internal mode is performed, and blocking the generation of the refresh signal based on the blocking control signal, and an internal voltage generation circuit suitable for adjusting a level of an internal voltage for the refresh operation based on the internal voltage control signal.

Furthermore, the present disclosure provides an electronic device including, an internal mode control circuit suitable for generating an internal voltage control signal based on a refresh cycle when an internal mode is performed in a self-refresh operation, a boost control signal generation circuit suitable for generating a boost control signal depending on whether the internal mode is performed in the self-refresh operation, and an internal voltage generation circuit suitable for adjusting a level of an internal voltage for a refresh operation based on the internal voltage control signal and the boost control signal.

BRIEF DESCRIPTION OF THE DRAWINGS

FIG. 3 is a table illustrating an operation for generating a first mode entry command and a second mode entry command outputted from an internal command generation circuit included in the electronic device illustrated in FIG. 2.

FIG. 11 is a table illustrating an operation that controls the level of an internal voltage outputted from an internal voltage generation circuit included in the electronic device illustrated in FIG. 2.

DETAILED DESCRIPTION OF THE EMBODIMENTS

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period in which the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal with a first voltage correspond to a signal with a logic "high" level, a signal with a second voltage correspond to a signal with a logic "low" level. In an embodiment, the logic "high" level may be set as a voltage level, which is higher than a voltage level of the logic "low" level. Meanwhile, logic levels of signals may be set to be different or opposite according to the embodiments. For example, a certain signal with a logic "high" level in one embodiment may be set to have a logic "low" level in another embodiment, or vice versa.

Various embodiments of the present disclosure will be described hereinafter in detail with reference to the accompanying drawings. However, the embodiments described herein are for illustrative purposes only and are not intended to limit the scope of the disclosed technology.

Figure 1:
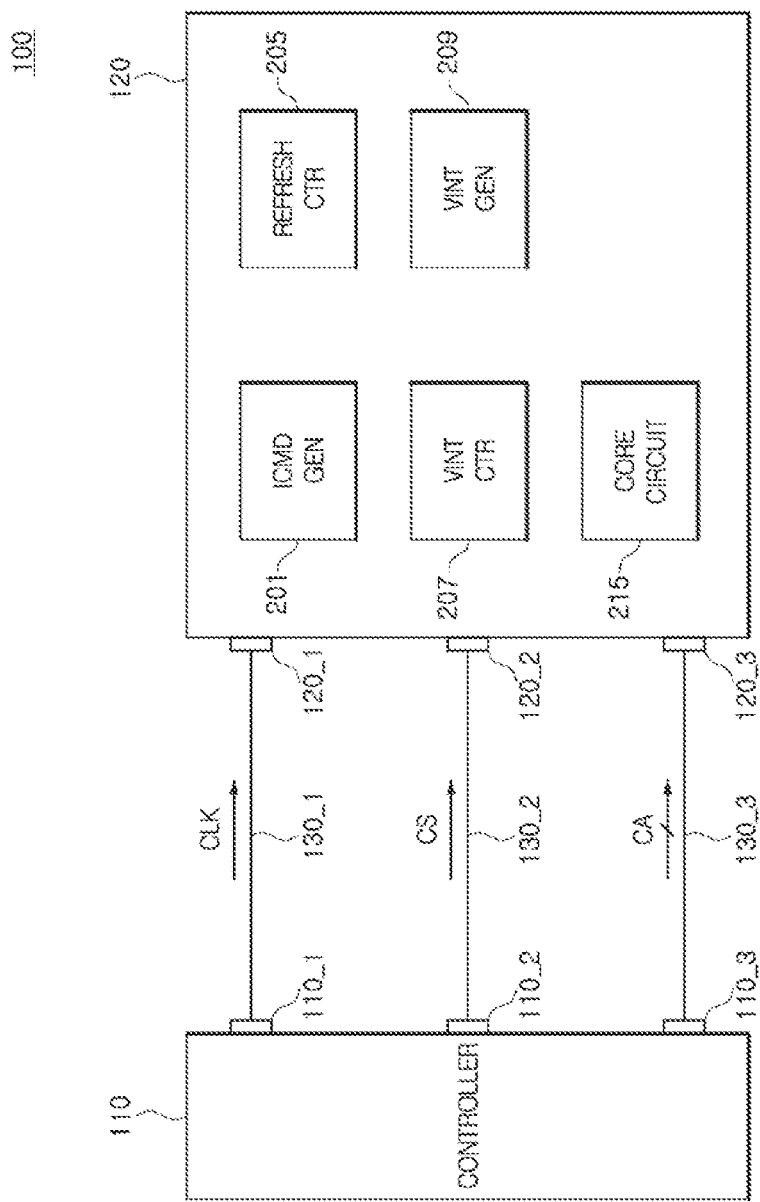
FIG. 1 is a block diagram illustrating a configuration of an electronic system according to an embodiment of the disclosed technology.

FIG. 1 is a block diagram illustrating a configuration of an electronic system 100 according to an embodiment of the disclosed technology. As illustrated in FIG. 1, the electronic system 100 may include a controller 110 and an electronic device 120.

The controller 110 may include a first control pin 110_1, a second control pin 110_2, and a third control pin 110_3. The electronic device 120 may include a first device pin 120_1, a second device pin 120_2, and a third device pin 120_3. The controller 110 may transmit a clock signal CLK to the electronic device 120 through a first transmission line 130_1 that connects the first control pin 110_1 and the first device pin 120_1 to each other. The controller 110 may transmit a chip selection signal CS to the electronic device 120 through a second transmission line 130_2 that connects the second control pin 110_2 and the second device pin 120_2 to each other. The controller 110 may transmit a command/address signal CA to the electronic device 120 through a third transmission line 130_3 that connects the third control pin 110_3 and the third device pin 120_3 to each other. The number of bits that are included in the command/address signal CA may be set to be different according to the embodiments.

The electronic device 120 may include an internal command generation circuit (ICMD GEN) 201, a refresh control circuit (REFRESH CTR) 205, an internal voltage control circuit (VINT CTR) 207, an internal voltage generation circuit (VINT GEN) 209, and a core circuit 215. The electronic device 120 may be realized through a semiconductor device. The electronic device 120 may receive the clock signal CLK, the chip selection signal CS, and the command/address signal CA from the controller 110 to perform a self-refresh operation or a normal operation. The normal operation may include various internal operations, such as a write operation, a read operation an active operation, and so forth.

The internal command generation circuit 201 may generate a self-refresh command (SREF in FIG. 2) to perform the self-refresh operation based on the clock signal CLK, the chip selection signal CS, and the command/address signal CA and a first mode entry command (DSM in FIG. 2) that executes a first internal mode during the self-refresh operation. The refresh control circuit 205 may generate a refresh signal (REF in FIG. 2) to periodically perform a refresh operation based on the self-refresh command (SREF in FIG. 2). The internal voltage control circuit 207 may generate an internal voltage control signal (CTR_VINT in FIG. 2) that controls the level of an internal voltage (VINT in FIG. 2) based on the first mode entry command (DSM in FIG. 2). The internal voltage generation circuit 209 may adjust the level of the internal voltage (VINT in FIG. 2) based on the internal voltage control signal (CTR_VINT in FIG. 2). The core circuit 215 may receive the internal voltage (VINT in FIG. 2) to perform the refresh operation based on the refresh signal (REF in FIG. 2).

Figure 2:
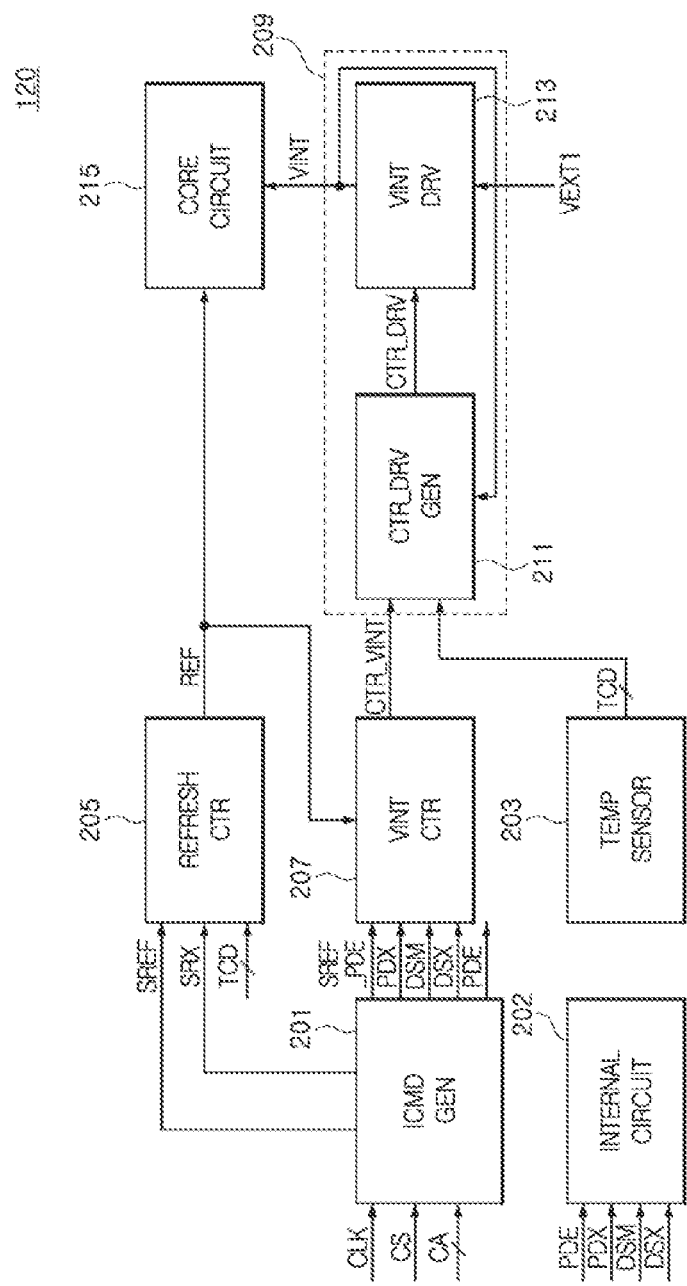
FIG. 2 is a block diagram illustrating a configuration of an electronic device included in the electronic system illustrated in FIG. 1.

FIG. 2 is a block diagram illustrating a configuration of the electronic device 120 included in the electronic system 100 illustrated in FIG. 1. As illustrated in FIG. 2, the electronic device 120 may include the internal command generation circuit 201, an internal circuit 202, a temperature sensing circuit (TEMP SENSOR) 203, the refresh control circuit 205, the internal voltage control circuit 207, the internal voltage generation circuit 209, and the core circuit 215.

The internal command generation circuit 201 may be synchronized with the clock signal CLK to generate the self-refresh command SREF, a self-refresh exit command SRX, the first mode entry command DSM, a first mode exit command DSX, a second mode entry command PDE, a second mode exit command PDX, and a synthesis control command SREF_PDE based on the chip selection signal CS and the command/address signal CA. The internal command generation circuit 201 may generate the self-refresh command SREF based on the chip selection signal CS and command/address signal CA, which have a logic level combination to perform the self-refresh operation. The self-refresh command SREF may be activated to perform the self-refresh operation. The self-refresh command SREF may be deactivated to perform the normal operation. The internal command generation circuit 201 may generate the self-refresh exit command SRX based on the chip selection signal CS and the command/address signal CA, which have a logic level combination that terminates the self-refresh operation. The self-refresh exit command SRX may be activated to terminate the self-refresh operation. The internal command generation circuit 201 may generate the first mode entry command DSM based on the chip selection signal CS and the command/address signal CA, which have a logic level combination that executes the first internal mode when the self-refresh operation is performed. The first mode entry command DSM may be activated to execute the first internal mode when the self-refresh operation is performed. The Internal command generation circuit 201 may generate the first mode exit command DSX based on the chip selection signal CS when the first internal mode is executed during the self-refresh operation. The first mode exit command DSX may be activated to terminate the first internal mode. The first internal mode may be set as a deep sleep mode for inhibiting a power voltage from being supplied to the internal circuit 202 of the electronic device 120. An exit period of the first Internal mode may be set to be longer than an exit period of the self-refresh operation. The exit period of the first internal mode may be set as a period from a point in time in which the first mode exit command DSX that terminates the first internal mode is activated to a point in time in which the first internal mode substantially terminates. The exit period of the self-refresh operation may be set as a period from a point in time in which the self-refresh exit command SRX that terminates the self-refresh operation is activated to a point in time in which the self-refresh operation substantially terminates. Thus, the self-refresh operation accompanying the first internal mode may provide sufficient time to recover the adjusted level of the internal voltage VINT as compared to the self-refresh operation performed without accompanying the first internal mode. The internal command generation circuit 201 may generate the second mode entry command PDE based on the chip selection signal CS and the command/address signal CA, which have a logic level combination that executes a second internal mode. The second mode entry command PDE may be activated to execute the second internal mode. The second mode entry command PDE may be activated to execute the second internal mode during the self-refresh operation or during a normal mode in which the normal operation is performed. The second internal mode may be set as a power-down mode that controls the power source supplied to the internal circuit 202. The internal command generation circuit 201 may generate the second mode exit command PDX based on the chip selection signal CS in the first internal mode. The second mode exit command PDX may be activated to terminate the second internal mode. The internal command generation circuit 201 may generate the synthesis control command SREF_PDE when the chip selection signal CS and the command/address signal CA have a logic level combination that executes the self-refresh operation or the second internal mode. The synthesis control command SREF_PDE may be activated when the self-refresh operation or the second internal mode is executed. The internal command generation circuit 201 may sequentially activate the first mode entry command DSM, the first mode exit command DSX, the second mode entry command PDE, the second mode exit command PDX based on the chip selection signal CS and the command/address signal CA when the self-refresh operation is performed. More specifically, the internal command generation circuit 201 may activate the first mode entry command DSM based on the chip selection signal CS and the command/address signal CA, which have a logic level combination that executes the first internal mode when the self-refresh operation is performed. When the chip selection signal CS is activated in the first internal mode, the internal command generation circuit 201 may activate the first mode exit command DSX that terminates the first internal mode and may activate the second mode entry command PDE that executes the second internal mode. The internal command generation circuit 201 may activate the second mode exit command PDX that terminates the second internal mode when the chip selection signal CS is activated in the second internal mode. A configuration and an operation of the internal command generation circuit 201 will be described more fully with reference to FIGS. 3 and 4 later.

The internal circuit 202 may execute the first internal mode or the second internal mode based on the first mode entry command DSM, the first mode exit command DSX, the second mode entry command PDE, and the second mode exit command PDX. The internal circuit 202 may execute the first internal mode based on the first mode entry command DSM and the first mode exit command DSX. The internal circuit 202 may execute the second internal mode based on the second mode entry command PDE and the second mode exit command PDX.

The temperature sensing circuit 203 may detect the internal temperature of the electronic device 120 to generate a temperature code TCD. The number of bits included in the temperature code TCD may be set to be different according to the embodiments. The temperature code TCD may have a logic level combination corresponding to the temperature range that the internal temperature is within. The internal temperature may be within a first temperature range or a second temperature range. For example, the temperature sensing circuit 203 may generate the temperature code TCD with a logic level combination corresponding to the first temperature range when the internal temperature is within the first temperature range. In addition, the temperature sensing circuit 203 may generate the temperature code TCD with a logic level combination corresponding to the second temperature range when the internal temperature is within the second temperature range. In this particular embodiment, the temperatures in the second temperature range are higher than the temperatures in the first temperature range. the However, the present disclosure is not limited thereto.

The refresh control circuit 205 may generate the refresh signal REF based on the self-refresh command SREF, the self-refresh exit command SRX, and the temperature code TCD. The refresh signal REF may be periodically activated to perform the refresh operation during the self-refresh operation. The refresh control circuit 205 may periodically activate the refresh signal REF during the self-refresh operation. That is, the refresh control circuit 205 may periodically activate the refresh signal REF when the self-refresh command SREF is activated. The refresh control circuit 205 may deactivate the refresh signal REF when the self-refresh exit command SRX is activated. The refresh control circuit 205 may adjust a cycle of the refresh signal REF according to a logic level combination of the temperature code TCD during the self-refresh operation. For example, the refresh control circuit 205 may generate the refresh signal REF with a first cycle when the temperature code TCD has a logic level combination corresponding to the first temperature range during the self-refresh operation. In addition, the refresh control circuit 205 may generate the refresh signal REF with a second cycle when the temperature code TCD has a logic level combination corresponding to the second temperature range during the self-refresh operation. The second cycle of the refresh signal REF may be set to be less than the first cycle of the refresh signal REF.

The internal voltage control circuit 207 may generate the internal voltage control signal CTR_VINT based on the first mode entry command DSM, the first mode exit command DSX, the synthesis control command SREF_PDE, the second mode exit command PDX, and the refresh signal REF. The internal voltage control signal CTR_VINT may be activated to adjust the level of the internal voltage VINT according to the temperature range that the internal temperature is within during a voltage adjustment period. The internal voltage control circuit 207 may generate the internal voltage control signal CTR_VINT when the first internal mode is executed during a period that is longer than a set operation period based on the first mode entry command DSM, the first mode exit command DSX, the synthesis control command SREF_PDE, and the second mode exit command PDX during the self-refresh operation. The set operation period may be set to be different according to the embodiments. Thus, the internal voltage control circuit 207 may generate the internal voltage control signal CTR_VINT that adjusts the level of the internal voltage VINT when the first internal mode is executed during a period that is longer than the set operation period while the self-refresh operation is being performed, thereby providing sufficient time to recover the adjusted level of the internal voltage VINT and reducing the amount of peak current that increases when the level of the internal voltage VINT is repeatedly adjusted.

The internal voltage control circuit 207 may activate the internal voltage control signal CTR_VINT during the voltage adjustment period based on the refresh signal REF and the first mode exit command DSX when the first internal mode is executed during a period that is longer than the set operation period while the self-refresh operation is being performed. When the first internal mode is executed during a period that is longer than the set operation period while the self-refresh operation is being performed, the internal voltage control circuit 207 may activate the internal voltage control signal CTR_VINT based on the refresh signal REF and may deactivate the internal voltage control signal CTR_VINT based on the first mode exit command DSX. More specifically, the internal voltage control circuit 207 may activate an extraction refresh signal (REF_EXTRACT in FIG. 9) when the refresh signal REF is activated after the set operation period. The internal voltage control circuit 207 may delay the extraction refresh signal REF_EXTRACT by a first internal delay period to generate a delayed extraction refresh signal (REF_EXTRACT_d in FIG. 9). The first internal delay period may be set to include a period from a point in time in which the refresh signal REF is activated to a point in time in which the refresh operation terminates in the core circuit 215. That is, the first internal delay period may be set to include a period in which the refresh operation is performed. The internal voltage control circuit 207 may activate the internal voltage control signal CTR_VINT when the delayed extraction refresh signal REF_EXTRACT_d is activated. The internal voltage control circuit 207 may delay the first mode exit command DSX by a second internal delay period to generate a delayed mode exit command (DSX_d in FIG. 9). The second internal delay period may be set to include a period from a point in time in which the refresh signal REF is activated to a point in time when the refresh operation terminates in the core circuit 215. That is, the second internal delay period may be set to include a period in which the refresh operation is performed. In some embodiments, the second internal delay period may be set to have the same delay time as the first internal delay period. The internal voltage control signal CTR_VINT may be deactivated when the delayed mode exit command DSX_d is activated. That is, the voltage adjustment period may be set as a period from a point in time in which the delayed extraction refresh signal REF_EXTRACT_d is activated to a point in time in which the delayed mode exit command DSX_d is activated. Thus, the internal voltage control circuit 207 may adjust the level of the internal voltage VINT after a point in time when the refresh operation terminates while the self-refresh operation is being performed, thereby preventing an abnormal operation from being performed when the level of the internal voltage VINT is adjusted during the refresh operation. A configuration and an operation of the internal voltage control circuit 207 will be described more fully with reference to FIG. 5 later.

The internal voltage generation circuit 209 may include a drive control signal generation circuit (CTR_DRV GEN) 211 and an internal voltage drive circuit (VINT DRV) 213. The internal voltage generation circuit 209 may generate the internal voltage VINT based on a first external voltage VEXT1, the internal voltage control signal CTR_VINT, and the temperature code TCD. The internal voltage generation circuit 209 may generate the internal voltage VINT with the level corresponding to a temperature range that the internal temperature is within according to a logic level combination of the temperature code TCD during the voltage adjustment period based on the internal voltage control signal CTR_VINT. More specifically, the internal voltage generation circuit 209 may generate the internal voltage VINT with a first level when the internal temperature is within the first temperature range during a period in which the internal voltage control signal CTR_VINT is activated. Moreover, the internal voltage generation circuit 209 may generate the internal voltage VINT with a second level when the internal temperature is within the second temperature range during a period in which the internal voltage control signal CTR_VINT is activated. The first level and the second level may be set to have negative voltages according to the embodiments. The second level may be set to be lower than the first level according to the embodiments. The internal voltage generation circuit 209 may generate the internal voltage VINT with a uniform level regardless of a logic level combination of the temperature code TCD while the internal voltage control signal CTR_VINT is deactivated. That is, the internal voltage generation circuit 209 may generate the internal voltage VINT with a uniform level regardless of the temperature range that the internal temperature is within while the internal voltage control signal CTR_VINT is being deactivated. More specifically, while the internal voltage control signal CTR_VINT is deactivated, the internal voltage generation circuit 209 may generate the internal voltage VINT with the second level when the internal temperature is within the first temperature range and may generate the internal voltage VINT with the second level even when the internal temperature is within the second temperature range. That is, the internal voltage generation circuit 209 may generate the internal voltage VINT with the second level when the internal voltage control signal CTR_VINT is activated and the internal temperature is within the second temperature range and may also generate the internal voltage VINT with the second level even when the internal voltage control signal CTR_VINT is deactivated.

The drive control signal generation circuit 211 may detect the level of the internal voltage VINT based on the internal voltage control signal CTR_VINT and the temperature code TCD to generate a drive control signal CTR_DRV. The drive control signal CTR_DRV may be generated to adjust and maintain the level of the internal voltage VINT. The drive control signal CTR_DRV may have a first logic level to boost the level of the internal voltage VINT. The drive control signal CTR_DRV may have a second logic level to lower the level of the internal voltage VINT. In an embodiment, the first logic level may be set as a logic "low" level, and the second logic level may be set as a logic "high" level. The drive control signal generation circuit 211 may adjust the logic level of the drive control signal CTR_DRV to maintain the level of the internal voltage VINT based on the internal voltage control signal CTR_VINT and the temperature code TCD.

The drive control signal generation circuit 211 may generate the drive control signal CTR_DRV with the first logic level until the level of the internal voltage VINT is adjusted from the second level to the first level when the internal temperature is within the first temperature range while the internal voltage control signal CTR_VINT is activated. The drive control signal generation circuit 211 may adjust the logic level of the drive control signal CTR_DRV to maintain the first level of the internal voltage VINT when the internal voltage VINT has the first level while the internal voltage control signal CTR_VINT is activated. For example, when the internal voltage VINT has the level, which is lower than the first level, the drive control signal generation circuit 211 may adjust the logic level of the drive control signal CTR_DRV to the first logic level to boost the level of the internal voltage VINT to the first level. In contrast, when the internal voltage VINT has the level, which is higher than the first level, the drive control signal generation circuit 211 may adjust the logic level of the drive control signal CTR_DRV to the second logic level to lower the level of the internal voltage VINT to the first level. The drive control signal generation circuit 211 may generate the drive control signal CTR_DRV with the second logic level until the level of the internal voltage VINT is adjusted from the first level to the second level when the internal voltage control signal CTR_VINT is deactivated during the voltage adjustment period and the internal voltage VINT has the first level. That is, the drive control signal generation circuit 211 may generate the drive control signal CTR_DRV with the second logic level until the level of the internal voltage VINT is adjusted from the first level to the second level when the internal voltage VINT has the first level at an end point of the voltage adjustment period.

The drive control signal generation circuit 211 may adjust the logic level of the drive control signal CTR_DRV to maintain the second level of the internal voltage VINT when the internal voltage VINT is within the second temperature range while the internal voltage control signal CTR_VINT is activated. The drive control signal generation circuit 211 may adjust the logic level of the drive control signal CTR_DRV to maintain the second level of the internal voltage VINT regardless of the temperature range that the internal temperature is within while the internal voltage control signal CTR_VINT is deactivated. For example, when the internal voltage VINT has the level, which is lower than the second level, the drive control signal generation circuit 211 may adjust the logic level of the drive control signal CTR_DRV to the first logic level to boost the level of the internal voltage VINT to the second level. In contrast, when the internal voltage VINT has the level, which is higher than the second level, the drive control signal generation circuit 211 may adjust the logic level of the drive control signal CTR_DRV to the second logic level to lower the level of the internal voltage VINT to the second level. A configuration and an operation of the drive control signal generation circuit 211 will be described more fully with reference to FIG. 12 later.

The internal voltage drive circuit 213 may generate the internal voltage VINT from the first external voltage VEXT1 based on the drive control signal CTR_DRV. The internal voltage drive circuit 213 may receive the first external voltage VEXT1 to drive the internal voltage VINT based on the drive control signal CTR_DRV. The internal voltage drive circuit 213 may boost the level of the internal voltage VINT when the drive control signal CTR_DRV has the first logic level. The internal voltage drive circuit 213 may lower the level of the internal voltage VINT when the drive control signal CTR_DRV has the second logic level. A configuration and an operation of the internal voltage drive circuit 213 will be described more fully with reference to FIG. 13 later.

The core circuit 215 may receive the internal voltage VINT to perform the refresh operation based on the refresh signal REF. The core circuit 215 may perform the refresh operation for detecting and amplifying levels of data that is stored in a memory cell array (303 in FIG. 14) whenever the refresh signal REF is activated. A configuration and an operation of the core circuit 215 will be described more fully with reference to FIG. 14 later.

FIG. 3 is a table illustrating an operation for generating the first mode entry command DSM and the second mode entry command PDE when the self-refresh operation is performed by the internal command generation circuit 201 included in the electronic device 120 illustrated in FIG. 2. Referring to FIG. 3, the internal command generation circuit 201 may be synchronized with a rising edge of the clock signal CLK to generate the self-refresh command SREF based on the chip selection signal CS and the command/address signal CA<1:7> with a logic level combination to perform the self-refresh operation. The logic level of the chip selection signal CS may be set as a logic "high(H)" level to perform the self-refresh operation. The command/address signal CA<1:7> may have a logic level combination of 'L, L, L, H, L, H, H' to perform the self-refresh operation. Thereafter, the internal command generation circuit 201 may be synchronized with a falling edge of the clock signal CLK to generate the first mode entry command DSM that executes the first internal mode based on a sixth bit signal CA<6> of the command/address signal CA<1:7>. The internal command generation circuit 201 may be synchronized with a falling edge of the clock signal CLK to activate the first mode entry command DSM when the sixth bit signal CA<6> of the command/address signal CA<1:7> has a logic "high(H)" level. The internal command generation circuit 201 may be synchronized with a falling edge of the clock signal CLK to generate the second mode entry command PDE that executes the second internal mode based on a seventh bit signal CA<7> of the command/address signal CA<1:7>. The internal command generation circuit 201 may be synchronized with a falling edge of the clock signal CLK to activate the second mode entry command PDE when the seventh bit signal CA<7> of the command/address signal CA<1:7> has a logic "high(H)" level. In such a case, the chip selection signal CS and first to fifth bit signals CA<1:5> of the command/address signal CA<1:7> may be set to have a don't care state 'X'. The don't care state 'X' means that any logic level is allowed to generate the corresponding commands (i.e., the first mode entry command DSM and the second mode entry command PDE) during the self-refresh operation.

Figure 4:
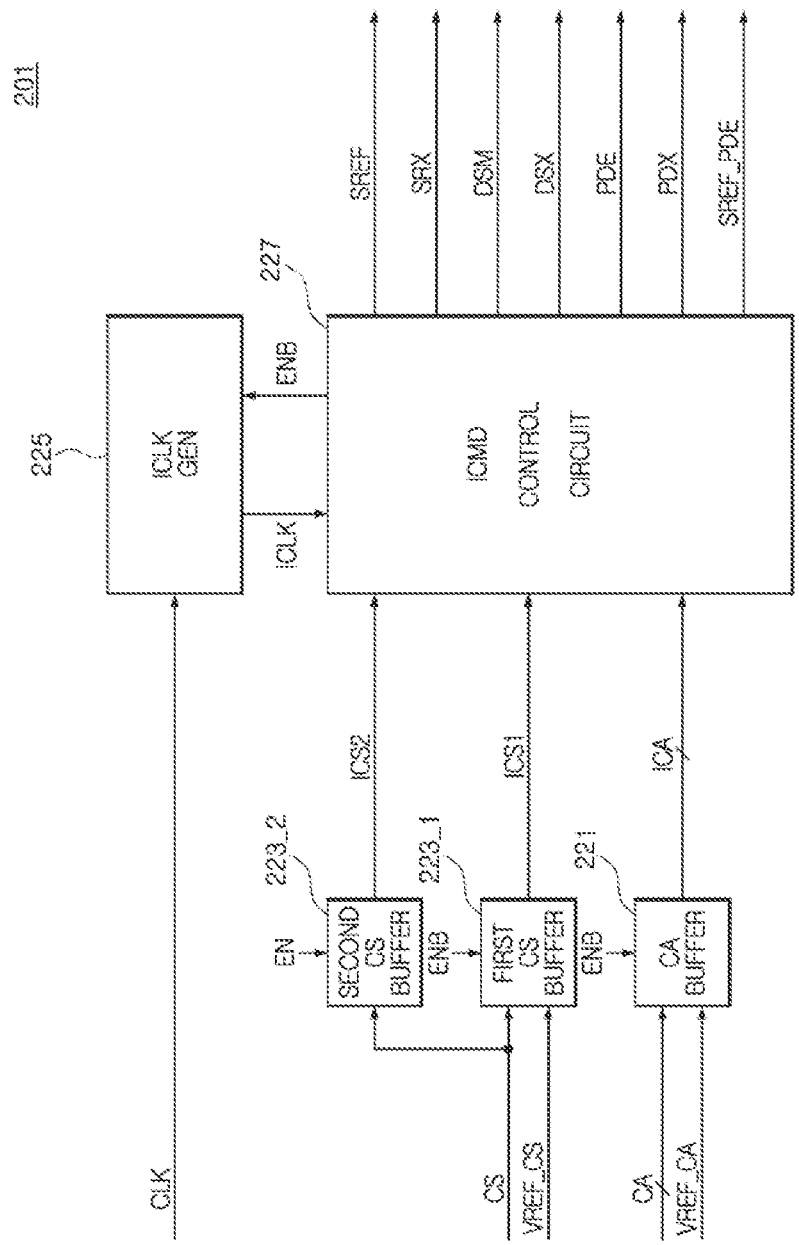
FIG. 4 is a block diagram illustrating a configuration of an internal command generation circuit included in the electronic device illustrated in FIG. 2.

FIG. 4 is a block diagram illustrating a configuration of the internal command generation circuit 201 included in the electronic device 120 illustrated in FIG. 2. Referring to FIG. 4, the internal command generation circuit 201 may include a command/address buffer circuit (CA BUFFER) 221, a first chip selection signal buffer circuit (FIRST CS BUFFER) 223_1, a second chip selection signal buffer circuit (SECOND CS BUFFER) 223_2, an internal clock signal generation circuit (ICLK GEN) 225, and an internal command control circuit (ICMD CONTROL CIRCUIT) 227.

The command/address buffer circuit 221 may buffer the command/address signal CA based on a command reference voltage VREF_CA and an inverted enablement signal ENB to output the buffered signal of the command/address signal CA as an internal command/address signal ICA. The command/address buffer circuit 221 may compare the level of the command/address signal CA with the level of the command reference voltage VREF_CA to generate the internal command/address signal ICA. The inverted enablement signal ENB may be deactivated when the first internal mode or the second internal mode is executed. The command/address buffer circuit 221 may be disabled when the inverted enablement signal ENB is deactivated. The command/address buffer circuit 221 may be realized by using a differential amplifier.

The first chip selection signal buffer circuit 223_1 may buffer the chip selection signal CS based on a chip selection signal reference voltage VREF_CS and the inverted enablement signal ENB to output the buffered signal of the chip selection signal CS as a first internal chip selection signal ICS1. The first chip selection signal buffer circuit 223_1 may compare the level of the chip selection signal CS with the level of the chip selection signal reference voltage VREF_CS to generate the first internal chip selection signal ICS1. The first chip selection signal buffer circuit 223_1 may be disabled when the inverted enablement signal ENB is deactivated. The first chip selection signal buffer circuit 223_1 may be realized by using a differential amplifier.

The second chip selection signal buffer circuit 223_2 may buffer the chip selection signal CS based on an enablement signal EN to generate a second internal chip selection signal ICS2. The enablement signal EN may be generated by inverting the level of the inverted enablement signal ENB. That is, the enablement signal EN may be activated when the first internal mode or the second internal mode is executed. The second chip selection signal buffer circuit 223_2 may be enabled when the enablement signal EN is activated. That is, the second chip selection signal buffer circuit 2232 may be enabled when the first internal mode or the second internal mode is executed. The second chip selection signal buffer circuit 223_2 may be realized by using a CMOS buffer.

The internal clock signal generation circuit 225 may generate an internal clock signal ICLK based on the clock signal CLK and the inverted enablement signal ENB. The internal clock signal generation circuit 225 may be disabled when the inverted enablement signal ENB is deactivated. The internal clock signal ICLK may be generated by dividing a frequency of the clock signal CLK.

The internal command control circuit 227 may be synchronized with the internal clock signal ICLK to generate the inverted enablement signal ENB, the self-refresh command SREF, the self-refresh exit command SRX, the first mode entry command DSM, the first mode exit command DSX, the second mode entry command PDE, the second mode exit command PDX, and the synthesis control command SREF_PDE based on the internal command/address signal ICA, the first internal chip selection signal ICS1, and the second internal chip selection signal ICS2. The internal command control circuit 227 may deactivate the inverted enablement signal ENB when the first internal mode and the second internal mode are executed. The internal command control circuit 227 may be synchronized with the internal clock signal ICLK to generate the self-refresh command SREF, the self-refresh exit command SRX, the first mode entry command DSM, the second mode entry command PDE, and the synthesis control command SREF_PDE based on the internal command/address signal ICA and the first internal chip selection signal ICS1. The internal command control circuit 227 may sequentially activate the first mode entry command DSM, the first mode exit command DSX, the second mode entry command PDE, and the second mode exit command PDX based on the internal command/address signal ICA, the first internal chip selection signal ICS1, and the second internal chip selection signal ICS2. More specifically, the internal command control circuit 227 may activate the first mode entry command DSM based on the internal command/address signal ICA and the first internal chip selection signal ICS1 with a logic level combination that executes the first internal mode when the self-refresh operation is performed. When the second internal chip selection signal ICS2 is activated while the first internal mode is executed, the internal command control circuit 227 may activate the first mode exit command DSX that terminates the first internal mode and may activate the second mode entry command PDE to perform the second internal mode. When the second internal chip selection signal ICS2 is activated while the second internal mode is executed, the internal command control circuit 227 may activate the second mode exit command PDX that terminates the second internal mode.

Figure 5:
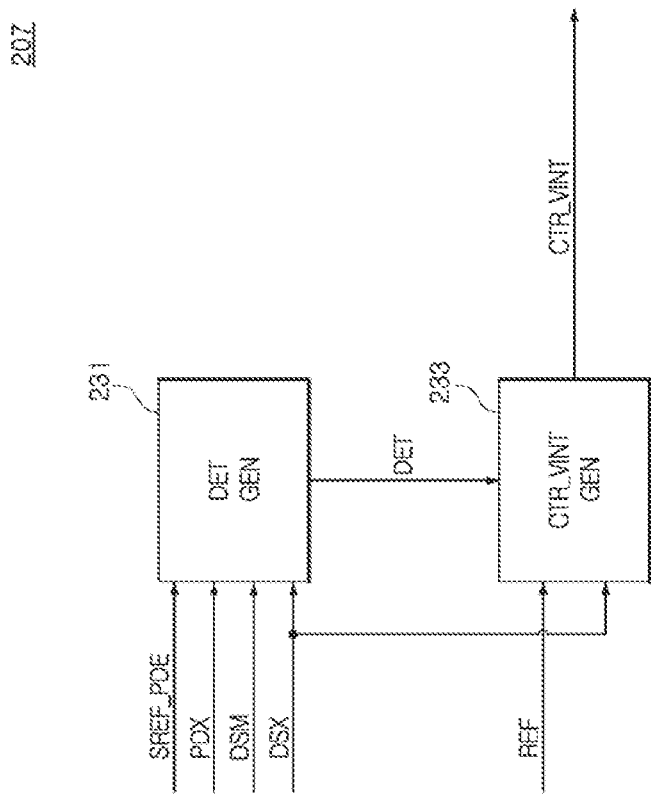
FIG. 5 is a block diagram illustrating a configuration of an internal voltage control circuit included in the electronic device illustrated in FIG. 2.

FIG. 5 is a block diagram illustrating a configuration of the internal voltage control circuit 207 included in the electronic device 120 illustrated in FIG. 2. Referring to FIG. 5, the internal voltage control circuit 207 may include a detection signal generation circuit (DET GEN) 231 and an internal voltage control signal generation circuit (CTR_VINT GEN) 233.

The detection signal generation circuit 231 may generate a detection signal DET based on the first mode entry command DSM, the first mode exit command DSX, the synthesis control command SREF_PDE, and the second mode exit command PDX. When the first internal mode is executed during a period that is longer than the set operation period while the self-refresh operation is being performed, the detection signal generation circuit 231 may activate the detection signal DET during a period from an end point of the set operation period to a point in time in which the first internal mode terminates. The detection signal DET may be activated to adjust the level of the internal voltage VINT according to the temperature range to which the internal temperature belongs. Thus, the detection signal generation circuit 231 may generate the detection signal DET that adjusts the level of the internal voltage VINT when the first internal mode is executed during a period that is longer than the set operation period while the self-refresh operation is being performed, thereby providing sufficient time to recover the adjusted level of the internal voltage VINT and reducing the amount of peak current that increases when the level of the internal voltage VINT is repeatedly adjusted. A configuration and an operation of the detection signal generation circuit 231 will be described more fully with reference to FIG. 6 later.

The internal voltage control signal generation circuit 233 may generate the internal voltage control signal CTR_VINT based on the detection signal DET, the refresh signal REF, and the first mode exit command DSX. The internal voltage control signal generation circuit 233 may activate the internal voltage control signal CTR_VINT during the voltage adjustment period based on the refresh signal REF and the first mode exit command DSX when the detection signal DET is activated. The internal voltage control signal generation circuit 233 may activate the internal voltage control signal CTR_VINT based on the detection signal DET and the refresh signal REF. More specifically, the internal voltage control signal generation circuit 233 may activate the extraction refresh signal (REF_EXTRACT in FIG. 9) when the detection signal DET and the refresh signal REF are activated. The internal voltage control signal generation circuit 233 may delay the extraction refresh signal REF_EXTRACT by the first internal delay period to generate the delayed extraction refresh signal (REF_EXTRACT_d in FIG. 9). The first internal delay period may be set to include a period in which the refresh operation is performed. The internal voltage control signal generation circuit 233 may activate the internal voltage control signal CTR_VINT when the delayed extraction refresh signal REF_EXTRACT_d is activated. The internal voltage control signal generation circuit 233 may deactivate the internal voltage control signal CTR_VINT based on the first mode exit command DSX. The internal voltage control signal generation circuit 233 may delay the first mode exit command DSX by the second internal delay period to generate the delayed mode exit command (DSX_d in FIG. 9). The second internal delay period may be set to include a period in which the refresh operation is performed. The internal voltage control signal generation circuit 233 may deactivate the internal voltage control signal CTR_VINT when the delayed mode exit command DSX_d is activated. That is, the voltage adjustment period may be set as a period from a point in time in which the delayed extraction refresh signal REF_EXTRACT_d is activated to a point in time in which the delayed mode exit command DSX_d is activated. Thus, the internal voltage control signal generation circuit 233 may adjust the level of the internal voltage VINT after a point in time when the refresh operation terminates while the self-refresh operation is being performed, thereby preventing an abnormal operation from being performed when the level of the internal voltage VINT is adjusted during the refresh operation. A configuration and an operation of the internal voltage control signal generation circuit 233 will be described more fully with reference to FIG. 9 later.

Figure 6:
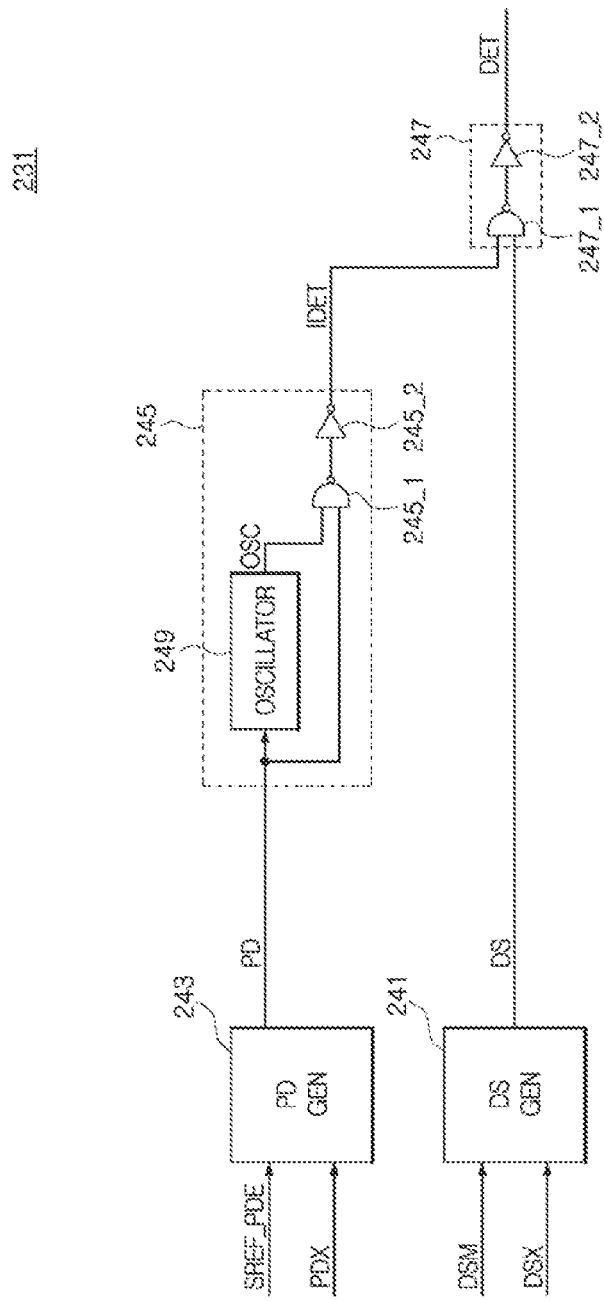
FIG. 6 illustrates an example of a detection signal generation circuit included in the internal voltage control circuit illustrated in FIG. 5.

FIG. 6 illustrates an example of the detection signal generation circuit 231 included in the internal voltage control circuit 207 illustrated in FIG. 5. As illustrated in FIG. 6, the detection signal generation circuit 231 may include a first mode signal generation circuit (DS GEN) 241, a second mode signal generation circuit (PD GEN) 243, an internal detection signal generation circuit 245, and a detection signal output circuit 247.

The first mode signal generation circuit 241 may generate a first mode signal DS based on the first mode entry command DSM and the first mode exit command DSX. The first mode signal DS may be activated while the first mode is executed during the self-refresh operation. The first mode signal generation circuit 241 may activate the first mode signal DS when the first mode entry command DSM is activated. The first mode signal generation circuit 241 may deactivate the first mode signal DS when the first mode exit command DSX is activated. The first mode signal generation circuit 241 may be realized by using an SR latch circuit.

The second mode signal generation circuit 243 may generate a second mode signal PD based on the synthesis control command SREF_PDE and the second mode exit command PDX. The second mode signal PD may be activated during a period from a point in time in which the synthesis control command SREF_PDE is activated to a point in time in which the second internal mode terminates. The second mode signal generation circuit 243 may activate the second mode signal PD when the synthesis control command SREF_PDE is activated. The second mode signal generation circuit 243 may deactivate the second mode signal PD when the second mode exit command PDX is activated. The second mode signal generation circuit 243 may be realized by using an SR latch circuit.

The internal detection signal generation circuit 245 may include an oscillation circuit 249, a NAND gate 245_1, and an inverter 245_2. The internal detection signal generation circuit 245 may generate an internal detection signal IDET when the second mode signal PD is activated during a period that is longer than the set operation period. That is, the internal detection signal IDET may be activated when the self-refresh operation is performed during a period that is longer than the set operation period. When the second mode signal PD is activated during a period that is longer than the set operation period, the internal detection signal generation circuit 245 may activate the internal detection signal IDET from an end point of the set operation period to an end point of the second internal mode. The oscillation circuit 249 may generate an oscillation signal OSC that is periodically toggled based on the second mode signal PD. The oscillation circuit 249 may activate the oscillation signal OSC after the set operation period elapses from a point in time when the second mode signal PD is activated. A configuration and an operation of the oscillation circuit 249 will be described more fully with reference to FIG. 7 later. The NAND gate 2451 may receive the second mode signal PD and the oscillation signal OSC to perform a logical NAND operation of the second mode signal PD and the oscillation signal OSC. The inverter 245_2 may inversely buffer an output signal of the NAND gate 245_1 to generate the internal detection signal IDET. A detailed operation for generating the internal detection signal IDET outputted from the internal detection signal generation circuit 245 will be described with reference to FIG. 8 later.

The detection signal output circuit 247 may generate the detection signal DET based on the first mode signal DS and the internal detection signal IDET. The detection signal output circuit 247 may activate the detection signal DET when the first mode signal DS and the internal detection signal IDET are activated. The detection signal output circuit 247 may activate the detection signal DET when the first mode signal DS is activated while the internal detection signal IDET is activated. The detection signal output circuit 247 may include a NAND gate 247_1 and an inverter 247_2. The NAND gate 247_1 may receive the internal detection signal IDET and the first mode signal DS to perform a logical NAND operation of the internal detection signal IDET and the first mode signal DS. The inverter 2472 may inversely buffer an output signal of the NAND gate 247_1 to output the inversely buffered signal of the output signal of the NAND gate 247_1 as the detection signal DET.

Figure 7:
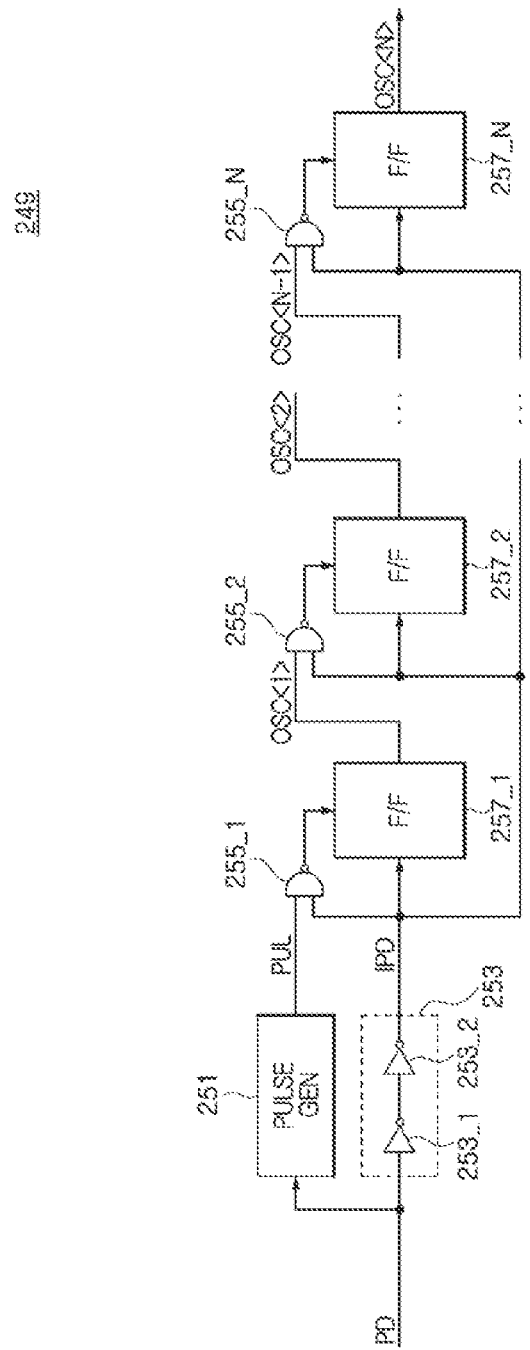
FIG. 7 illustrates an example of an oscillation circuit included in the detection signal generation circuit illustrated in FIG. 6.

FIG. 7 illustrates a configuration of the oscillation circuit 249 included in the detection signal generation circuit 231 illustrated in FIG. 6. The oscillation circuit 249 may include a pulse generation circuit (PULSE GEN) 251, a buffer circuit 253, NAND gates 255_1~255_N, and flip-flops (F/F) 257_1~257_N.

The pulse generation circuit 251 may generate a pulse signal PUL, which is periodically toggled based on the second mode signal PD. The pulse generation circuit 251 may periodically toggle the pulse signal PUL while the second mode signal PD is activated. The pulse signal PUL may be set to have a cycle of 'P'. The buffer circuit 253 may buffer the second mode signal PD to generate an internal mode signal IPD. The buffer circuit 253 may include inverters 253_1 and 253_2, which are coupled in series. The NAND gate 255_1 may receive the internal mode signal IPD and the pulse signal PUL to perform a logical NAND operation of the internal mode signal IPD and the pulse signal PUL. The flip-flop 257_1 may latch the internal mode signal IPD in synchronization with an output signal of the NAND gate 255_1 to generate a first oscillation signal OSC<1> of the oscillation signal OSC. The first oscillation signal OSC<1> may be generated to have a cycle of '2P'. The NAND gate 255_2 may receive the internal mode signal IPD and the first oscillation signal OSC<1> to perform a logical NAND operation of the internal mode signal IPD and the first oscillation signal OSC<1>. The flip-flop 257_2 may latch the internal mode signal IPD in synchronization with an output signal of the NAND gate 255_2 to generate a second oscillation signal OSC<2> of the oscillation signal OSC. The second oscillation signal OSC<2> may be generated to have a cycle of '4P'. The NAND gate 255_N may receive the internal mode signal IPD and an $(N-1)^{th}$ oscillation signal OSC<N-1> to perform a logical NAND operation of the internal mode signal IPD and the $(N-1)^{th}$ oscillation signal OSC<N-1>. The flip-flop 257_N may latch the internal mode signal IPD in synchronization with an output signal of the NAND gate 255_N to generate an $N^{th}$ oscillation signal OSC<N> of the oscillation signal OSC. The $N^{th}$ oscillation signal OSC<N> may be generated to have a cycle of 'N×P'.

Figure 8:
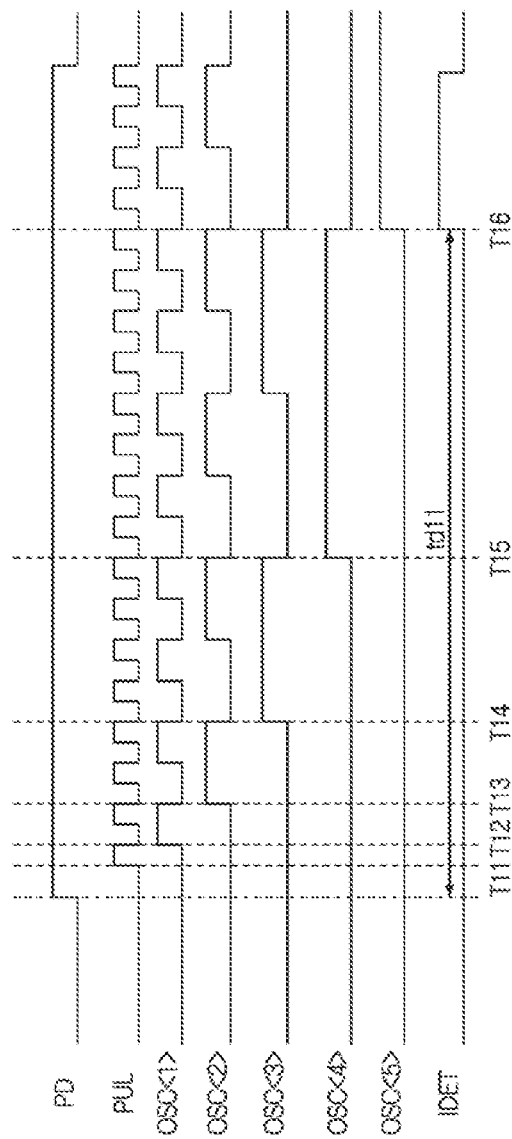
FIG. 8 is a timing diagram illustrating an operation for generating an internal detection signal outputted from an internal detection signal generation circuit included in the detection signal generation circuit illustrated in FIG. 6.

FIG. 8 is a timing diagram illustrating an operation for generating the internal detection signal IDET outputted from the internal detection signal generation circuit 245 included in the detection signal generation circuit 231 illustrated in FIG. 6. At a point in time "T11", the internal detection signal generation circuit 245 may generate the pulse signal (PUL in FIG. 7) with a cycle of 'P' based on the second mode signal PD. At a point in time "T12", the internal detection signal generation circuit 245 may be synchronized with the pulse signal PUL to generate the first oscillation signal (OSC<1> in FIG. 7) with a cycle of '2P'. At a point in time "T13", the internal detection signal generation circuit 245 may be synchronized with first oscillation signal (OSC<1> in FIG. 7) to generate the second oscillation signal (OSC<2> in FIG. 7) with a cycle of '4P'. At a point in time "T14", the internal detection signal generation circuit 245 may be synchronized with the second oscillation signal OSC<2> to generate a third oscillation signal OSC<3> with a cycle of '8P'. At a point in time "T15", the internal detection signal generation circuit 245 may be synchronized with the third oscillation signal OSC<3> to generate a fourth oscillation signal OSC<4> with a cycle of '16P'. At a point in time "T16", the internal detection signal generation circuit 245 may be synchronized with the fourth oscillation signal OSC<4> to generate a fifth oscillation signal OSC<5> with a cycle of '32P'. The fifth oscillation signal OSC<5> may be activated at a point in time when a set operation period "td11" elapses from a point in time when the second mode signal PD is activated. At the point in time "T16", the internal detection signal generation circuit 245 may generate the internal detection signal IDET, which is activated when both of the second mode signal PD and the fifth oscillation signal OSC<5> are activated.

Figure 9:
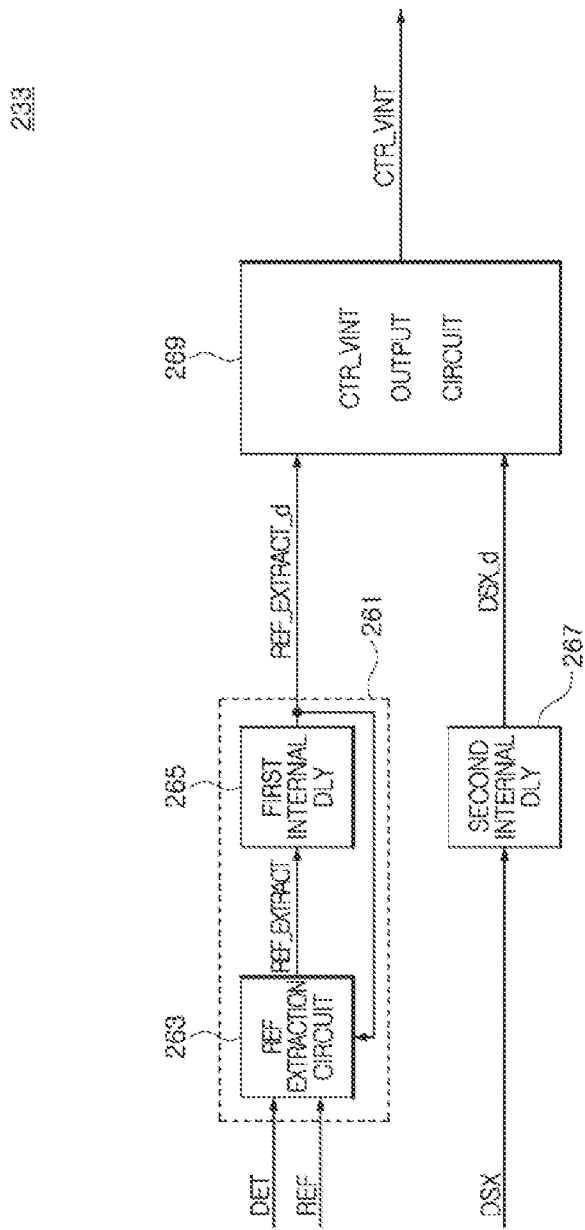
FIG. 9 is a block diagram illustrating a configuration of an internal voltage control signal generation circuit included in the internal voltage control circuit illustrated in FIG. 5.

FIG. 9 is a block diagram illustrating a configuration of the internal voltage control signal generation circuit 233 included in the internal voltage control circuit 207 illustrated in FIG. 5. As illustrated in FIG. 9, the internal voltage control signal generation circuit 233 may include a delayed extraction refresh signal generation circuit 261, a second internal delay circuit (SECOND INTERNAL DLY) 267, and an internal voltage control signal output circuit (CTR_VINT OUTPUT CIRCUIT) 269.

The delayed extraction refresh signal generation circuit 261 may include a refresh extraction circuit (REF EXTRACTION CIRCUIT) 263 and a first internal delay circuit (FIRST INTERNAL DLY) 265. The delayed extraction refresh signal generation circuit 261 may generate the delayed extraction refresh signal REF_EXTRACT_d based on the detection signal DET and the refresh signal REF. The delayed extraction refresh signal generation circuit 261 may activate the extraction refresh signal REF_EXTRACT when the detection signal DET and the refresh signal REF are activated. The delayed extraction refresh signal generation circuit 261 may delay the extraction refresh signal REF_EXTRACT by the first internal delay period to generate the delayed extraction refresh signal REF_EXTRACT_d that is activated.

The refresh extraction circuit 263 may generate the extraction refresh signal REF_EXTRACT based on the detection signal DET, the refresh signal REF, and the delayed extraction refresh signal REF_EXTRACT_d. The refresh extraction circuit 263 may activate the extraction refresh signal REF_EXTRACT based on the delayed extraction refresh signal REF_EXTRACT_d when the detection signal DET is activated while the refresh signal REF is activated. The refresh extraction circuit 263 may deactivate the extraction refresh signal REF_EXTRACT when the delayed extraction refresh signal REF_EXTRACT_d is activated. A configuration and an operation of the refresh extraction circuit 263 will be described more fully with reference to FIG. 10 later.

The first internal delay circuit 265 may delay the extraction refresh signal REF_EXTRACT by the first internal delay period to generate the delayed extraction refresh signal REF_EXTRACT_d. The first internal delay period may be set to include a period in which the refresh operation is performed.

The second internal delay circuit 267 may delay the first mode exit command DSX by the second internal delay period to generate the delayed mode exit command DSX_d. The second internal delay period may be set to include a period in which the refresh operation is performed.

The internal voltage control signal output circuit 269 may generate the internal voltage control signal CTR_VINT based on the delayed extraction refresh signal REF_EXTRACT_d and the delayed mode exit command DSX_d. The internal voltage control signal output circuit 269 may activate the internal voltage control signal CTR_VINT when the delayed extraction refresh signal REF_EXTRACT_d is activated. The internal voltage control signal output circuit 269 may deactivate the internal voltage control signal CTR_VINT when the delayed mode exit command DSX_d is activated. The internal voltage control signal output circuit 269 may be realized by using an SR latch circuit.

Figure 10:
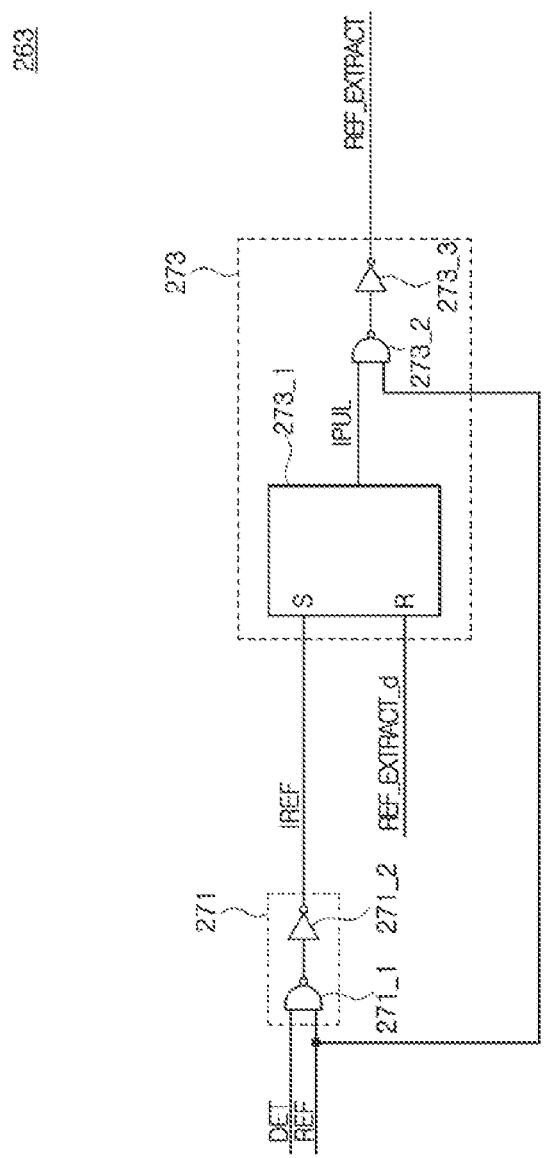
FIG. 10 illustrates an example of a refresh signal extraction circuit included in the internal voltage control signal generation circuit illustrated in FIG. 9.

FIG. 10 illustrates a configuration of the refresh signal extraction circuit 263 included in the internal voltage control signal generation circuit 233 illustrated in FIG. 9. As illustrated in FIG. 10, the refresh signal extraction circuit 263 may include an internal refresh signal generation circuit 271 and an extraction refresh signal generation circuit 273.

The internal refresh signal generation circuit 271 may generate an internal refresh signal IREF based on the detection signal DET and the refresh signal REF. The internal refresh signal generation circuit 271 may output the refresh signal REF, which is activated while the detection signal DET is activated, as the internal refresh signal IREF. The internal refresh signal generation circuit 271 may include a NAND gate 271_1 and an inverter 271_2. The NAND gate 271_1 may inversely buffer the refresh signal REF to output the inversely buffered signal of the refresh signal REF while the detection signal DET is activated to have a logic "high" level. The inverter 271_2 may inversely buffer an output signal of the NAND gate 271_1 to output the inversely buffered signal of the output signal of the NAND gate 271_1 as the internal refresh signal IREF.

The extraction refresh signal generation circuit 273 may generate the extraction refresh signal REF_EXTRACT based on the refresh signal REF, the internal refresh signal IREF, and the delayed extraction refresh signal REF_EXTRACT_d. The extraction refresh signal generation circuit 273 may generate an internal pulse signal IPUL based on the internal refresh signal IREF and the delayed extraction refresh signal REF_EXTRACT_d. The extraction refresh signal generation circuit 273 may activate the internal pulse signal IPUL when the internal refresh signal IREF is activated. The extraction refresh signal generation circuit 273 may deactivate the internal pulse signal IPUL when the delayed extraction refresh signal REF_EXTRACT_d is activated. That is, the extraction refresh signal generation circuit 273 may activate the internal pulse signal IPUL during a period from a point in time in which both of the detection signal DET and the refresh signal REF are activated to a point in time in which the delayed extraction refresh signal REF_EXTRACT_d, which is generated by delaying the extraction refresh signal REF_EXTRACT by the first internal delay period, is activated. The extraction refresh signal generation circuit 273 may generate the extraction refresh signal REF_EXTRACT based on the internal pulse signal IPUL and the refresh signal REF. The extraction refresh signal generation circuit 273 may output the refresh signal REF as the extraction refresh signal REF_EXTRACT while the internal pulse signal IPUL is activated. The extraction refresh signal generation circuit 273 may include an SR latch circuit 273_1, a NAND gate 273_2, and an inverter 273_3. The SR latch circuit 273_1 may generate the internal pulse signal IPUL, which is activated to have a logic "high" level when the internal refresh signal IREF is activated to have a logic "high" level and may generate the internal pulse signal IPUL, which is deactivated to have a logic "low" level when the delayed extraction refresh signal REF_EXTRACT_d is activated to have a logic "high" level. The NAND gate 273_2 may inversely buffer the refresh signal REF to output the inversely buffered signal of the refresh signal REF while the internal pulse signal IPUL is activated to have a logic "high" level. The inverter 273_3 may inversely buffer an output signal of the NAND gate 273_2 to output the inversely buffered signal of the output signal of the NAND gate 273_2 as the extraction refresh signal REF_EXTRACT.

FIG. 11 is a table illustrating an operation that controls the level of the internal voltage VINT outputted from the internal voltage generation circuit 209 included in the electronic device 120 illustrated in FIG. 2. Referring to FIG. 11, the internal voltage control signal CTR_VINT may be activated to have a logic "high(H)" level when the first internal mode is executed during the set operation period while the self-refresh operation is being performed. The internal voltage control signal CTR_VINT may be deactivated to have a logic "low" level when the normal operation is performed. As mentioned previously, the temperature range that the internal temperature is within may include the first temperature range and the second temperature range. The first temperature range may be set as a temperature range including a room temperature. The second temperature range may be set as a temperature range, which is higher than the first temperature range. The level of the internal voltage VINT may include a first level and a second level. Both of the first level and the second level may be set as negative voltages. The first level may be set to be higher than the second level. For example, the first level may be set as −0.3 volts and the second level may be set as −0.6 volts.

The internal voltage generation circuit 209 may generate the internal voltage VINT with the first level when the internal voltage control signal CTR_VINT is activated to have a logic "high(H)" level and the internal temperature is within the first temperature range. Thus, the internal voltage generation circuit 209 may generate the internal voltage VINT with the first level in the first temperature range when the self-refresh operation is performed, thereby reducing current leakage in the electronic device 120 as compared with current leakage generated when the internal voltage VINT with the second level is supplied to a bit line sense amplification circuit (BLSA) (305 in FIG. 14).

The internal voltage generation circuit 209 may generate the internal voltage VINT with the second level when the internal voltage control signal CTR_VINT is activated to have a logic "high(H)" level and the internal temperature is within the second temperature range. Thus, the internal voltage generation circuit 209 may generate the internal voltage VINT with the second level in the second temperature range when the self-refresh operation is performed, thereby reducing current leakage in the electronic device 120 as compared with current leakage generated when the internal voltage VINT with the first level is supplied to the memory cell array (303 in FIG. 14).

The internal voltage generation circuit 209 may generate the internal voltage VINT with the second level regardless of the temperature range that the internal temperature is within when the internal voltage control signal CTR_VINT is deactivated to have a logic "low(L)" level. Thus, the internal voltage generation circuit 209 may generate the internal voltage VINT with the second level regardless of the temperature range that the internal temperature is within during the normal operation, thereby suppressing or relieving a row hammer phenomenon, which is capable of occurring when the internal voltage VINT with the first level is supplied to the memory cell array (303 in FIG. 14).

Figure 12:
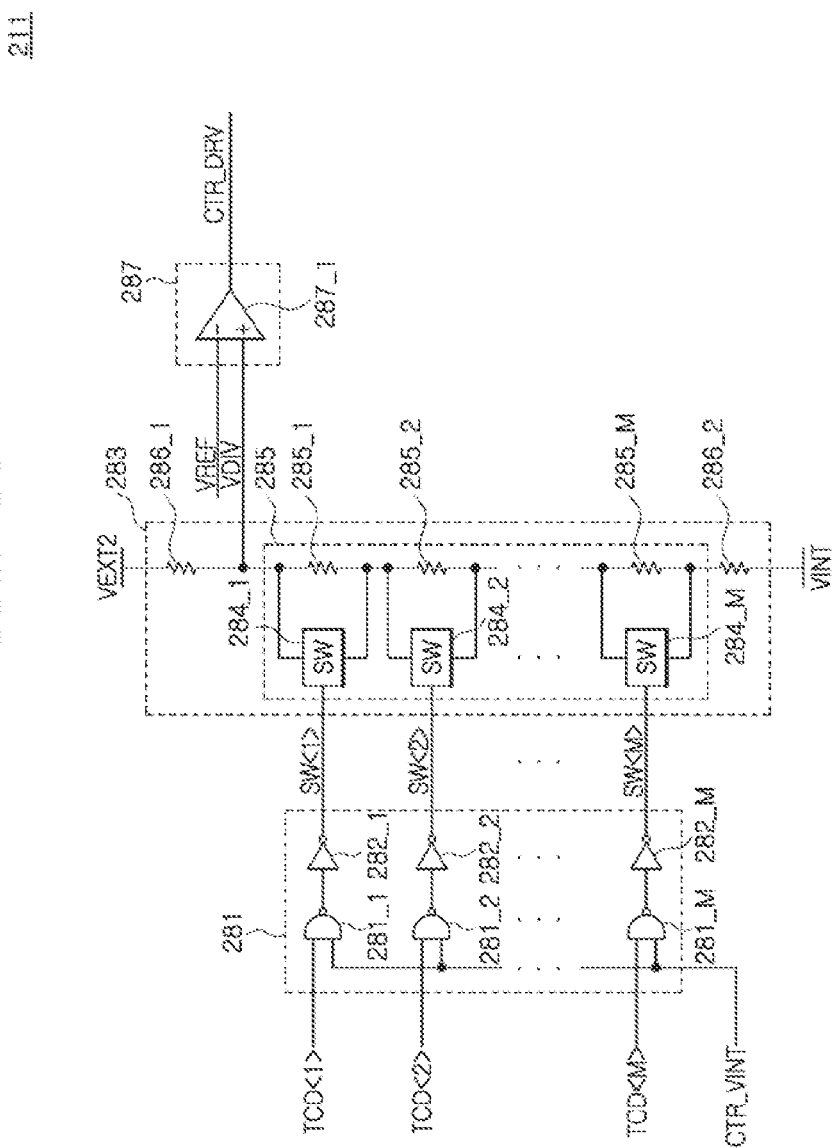
FIG. 12 illustrates an example of a drive control signal generation circuit included in the electronic device illustrated in FIG. 2.

FIG. 12 illustrates a configuration of the drive control signal generation circuit 211 included in the electronic device 120 illustrated in FIG. 2. As illustrated in FIG. 12, the drive control signal generation circuit 211 may include a switching signal generation circuit 281, a voltage division circuit 283, and a drive control signal output circuit 287.

The switching signal generation circuit 281 may generate a switching signal SW<1:M> based on the temperature code TCD<1:M> and the internal voltage control signal CTR_VINT. The switching signal SW<1:M> may be activated to adjust a resistance value of a variable resistive circuit 285 included in the voltage division circuit 283. The switching signal generation circuit 281 may buffer the temperature code TCD<1:M> to generate the switching signal SW<1:M> while the internal voltage control signal CTR_VINT is activated. More specifically, the switching signal generation circuit 281 may generate the switching signal SW<1:M> with a logic level combination corresponding to the first temperature range when a logic level combination of the temperature code TCD<1:M> corresponds to the first temperature range while the internal voltage control signal CTR_VINT is activated. The switching signal generation circuit 281 may activate a first switching signal SW<1> of the switching signal SW<1:M> when a logic level combination of the temperature code TCD<1:M> corresponds to the first temperature range while the internal voltage control signal CTR_VINT Is activated. The switching signal generation circuit 281 may generate the switching signal SW<1:M> with a logic level combination corresponding to the second temperature range when a logic level combination of the temperature code TCD<1:M> corresponds to the second temperature range while the internal voltage control signal CTR_VINT is activated. The switching signal generation circuit 281 may deactivate the first switching signal SW<1> of the switching signal SW<1:M> when a logic level combination of the temperature code TCD<1:M> corresponds to the second temperature range while the internal voltage control signal CTR_VINT is activated. The switching signal generation circuit 281 may deactivate the switching signal SW<1:M> regardless of a logic level combination of the temperature code TCD<1:M> when the internal voltage control signal CTR_VINT is deactivated. That is, the switching signal generation circuit 281 may deactivate the first switching signal SW<1> when a logic level combination of the temperature code TCD<1:M> corresponds to the second temperature range during a period in which the internal voltage control signal CTR_VINT is activated or when the internal voltage control signal CTR_VINT is deactivated. The switching signal generation circuit 281 may include NAND gates 281_1~281_M and inverters 282_1~282_M. The NAND gate 281_1 may inversely buffer a first bit TCD<1> of the temperature code TCD<1:M> to output the inversely buffered signal of the first bit TCD<1> of the temperature code TCD<1:M> while the internal voltage control signal CTR_VINT is activated to have a logic "high" level. The NAND gate 281_1 may output a signal with a logic "high" level regardless of the logic level of the first bit TCD<1> of the temperature code TCD<1:M> when the internal voltage control signal CTR_VINT is deactivated to have a logic "low" level. The inverter 282_1 may inversely buffer an output signal of the NAND gate 281_1 to output the inversely buffered signal of the output signal of the NAND gate 281_1 as the first switching signal SW<1>. Similarly, the NAND gate 281_M may inversely buffer an $M^{th}$ bit TCD<M> of the temperature code TCD<1:M> to output the inversely buffered signal of the $M^{th}$ bit TCD<M> of the temperature code TCD<1:M> while the internal voltage control signal CTR_VINT is activated to have a logic "high" level. The NAND gate 281_M may output a signal with a logic "high" level regardless of the logic level of the $M^{th}$ bit TCD<M> of the temperature code TCD<1:M> when the internal voltage control signal CTR_VINT is deactivated to have a logic "low" level. The inverter 282_M may inversely buffer an output signal of the NAND gate 281_M to output the inversely buffered signal of the output signal of the NAND gate 281_M as an $M^{th}$ switching signal SW<M> of the switching signal SW<1:M>.

The voltage division circuit 283 may include the variable resistive circuit 285 and resistive elements 286_1 and 286_2. The voltage division circuit 283 may adjust a resistance value of the variable resistive circuit 285 based on the switching signal SW<1:M>. More specifically, the voltage division circuit 283 may adjust a resistance value of the variable resistive circuit 285 from a first resistance value to a second resistance value when the first switching signal SW<1> is activated. The voltage division circuit 283 may adjust a resistance value of the variable resistive circuit 285 to the first resistance value when the first switching signal SW<1> is deactivated. The voltage division circuit 283 may detect the level of the internal voltage VINT based on a resistance value of the variable resistive circuit 285 to generate a divided voltage VDIV. The voltage division circuit 283 may generate the divided voltage VDIV from a second external voltage VEXT2 and the internal voltage VINT based on a resistance value of the variable resistive circuit 285. The second external voltage VEXT2 may be applied to the voltage division circuit 283 through a power pad (not shown). The voltage division circuit 283 may divide a voltage difference between the second external voltage VEXT2 and the internal voltage VINT according to a logic level combination of the switching signal SW<1:M> to generate the divided voltage VDIV.

A resistance value of the variable resistive circuit 285 may be adjusted according to a logic level combination of the switching signal SW<1:M>. The variable resistive circuit 285 may have a first resistance value when a logic level combination of the switching signal SW<1:M> corresponds to the first temperature range. The variable resistive circuit 285 may have a second resistance value when a logic level combination of the switching signal SW<1:M> corresponds to the second temperature range. The variable resistive circuit 285 may have the second resistance value when all of the first to $M^{th}$ switching signals SW<1:M> are deactivated. The variable resistive circuit 285 may include switching elements (SW) 284_1~284_M and resistive elements 285_1~285_M. The resistive elements 285_1~285_M may be coupled in series, and the switching elements 284_1~284_M may be coupled in parallel to respective ones of the resistive elements 285_1~285_M. The switching elements 284_1~284_M may be turned on or off according to logic levels of the first to $M^{th}$ switching signals SW<1:M>, respectively. The switching element 284_1 may be turned on when the first switching signal SW<1> is activated to have a logic "high" level. In contrast, the switching element 284_1 may be turned off when the first switching signal SW<1> is deactivated to have a logic "low" level. One end and the other end of the resistive element 285_1 may be coupled to one end and the other end of the switching element 2841, respectively. The resistive element 285_1 and the switching element 284_1 coupled in parallel may act as a short circuit when the switching element 284_1 is turned on. The resistive element 285_1 and the switching element 284_1 coupled in parallel may correspond to a resistor with a resistance value of the resistive element 285_1 when the switching element 284_1 is turned off.

The drive control signal output circuit 287 may compare the level of the divided voltage VDIV with the level of a reference voltage VREF to generate the drive control signal CTR_DRV. The divided voltage VDIV may be generated from the second external voltage VEXT2. In an embodiment, the divided voltage VDIV may be set to have the level, which is lower than the level of the second external voltage VEXT2. The drive control signal output circuit 287 may compare the level of the divided voltage VDIV with the level of a reference voltage VREF to generate and output the drive control signal CTR_DRV with one of a first logic level and a second logic level. For example, the drive control signal output circuit 287 may output the drive control signal CTR_DRV with the first logic level when the level of the divided voltage VDIV is equal to or lower than the level of the reference voltage VREF. In contrast, the drive control signal output circuit 287 may output the drive control signal CTR_DRV with the second logic level when the level of the divided voltage VDIV is higher than the level of the reference voltage VREF. In an embodiment, the first logic level may be set as a logic "low" level, and the second logic level may be set as a logic "high" level. The drive control signal output circuit 287 may be realized by using a differential amplification circuit 287_1.

Figure 13:
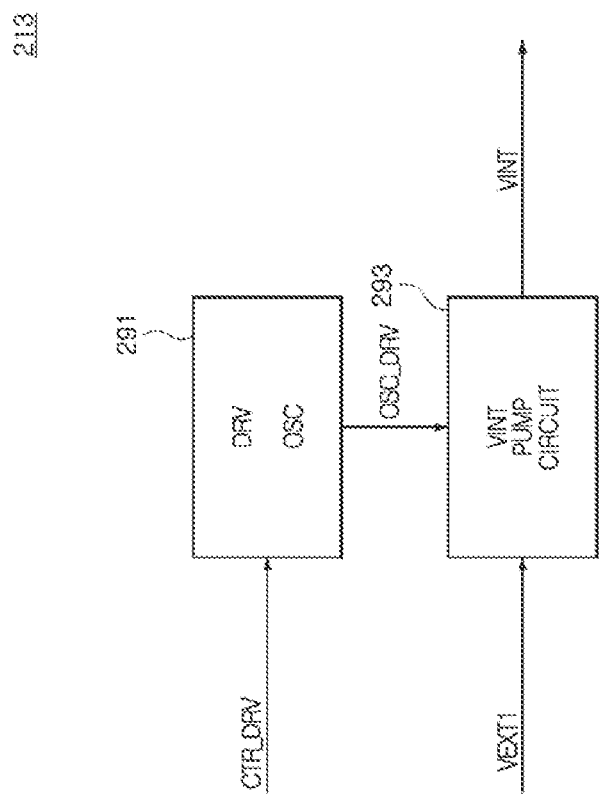
FIG. 13 is a block diagram illustrating a configuration of an internal voltage drive circuit included in the electronic device illustrated in FIG. 2.

FIG. 13 is a block diagram illustrating a configuration of the internal voltage drive circuit 213 included in the electronic device 120 illustrated in FIG. 2. As illustrated in FIG. 13, the internal voltage drive circuit 213 may include a drive oscillation signal generation circuit (DRV OSC) 291 and an internal voltage pump circuit (VINT PUMP CIRCUIT) 293.

The drive oscillation signal generation circuit 291 may generate a drive oscillation signal OSC_DRV based on the drive control signal CTR_DRV. The drive oscillation signal generation circuit 291 may generate the drive oscillation signal OSC_DRV, which is not toggled when the drive control signal CTR_DRV has the first logic level. In contrast, the drive oscillation signal generation circuit 291 may generate the drive oscillation signal OSC_DRV, which is toggled when the drive control signal CTR_DRV has the second logic level.

The internal voltage pump circuit 293 may generate the internal voltage VINT from the first external voltage VEXT1 based on the drive oscillation signal OSC_DRV. The internal voltage pump circuit 293 may drive the internal voltage VINT to a relatively low level based on the first external voltage VEXT1 when the drive oscillation signal OSC_DRV is toggled. The internal voltage pump circuit 293 may drive the internal voltage VINT to a relatively high level based on the first external voltage VEXT1 when the drive oscillation signal OSC_DRV is not toggled.

Figure 14:
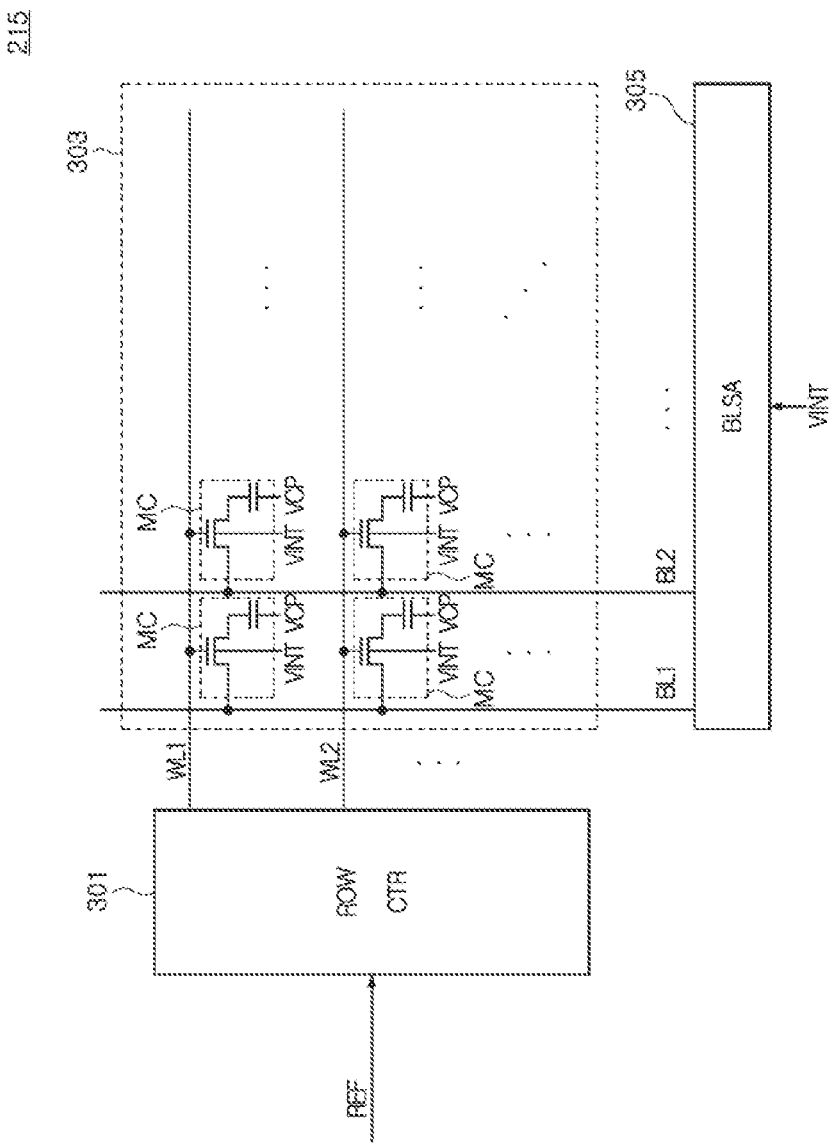
FIG. 14 illustrates an example of a core circuit included in the electronic device illustrated in FIG. 2.

FIG. 14 illustrates a configuration of the core circuit 215 included in the electronic device 120 illustrated in FIG. 2. As illustrated in FIG. 14, the core circuit 215 may include a row control circuit (ROW CTR) 301, the memory cell array 303, and the bit line sense amplification circuit 305.

The row control circuit 301 may activate one of word lines WL based on the refresh signal REF. The row control circuit 301 may sequentially activate the word lines WL whenever the refresh signal REF is activated. For example, the row control circuit 301 may active a first word line WL1 when the refresh signal REF is activated a first time, and the row control circuit 301 may active a second word line WL2 when the refresh signal REF is activated a second time.

The memory cell array 303 may include a plurality of memory cells MC. Each of the plurality of memory cells MC may include a cell transistor and a cell capacitor. The cell transistor included in each memory cell may receive the internal voltage VINT to store data in the cell capacitor or to output the data that is stored in the call capacitor. The internal voltage VINT may be supplied to the cell transistor to act as a back bias voltage of the cell transistor. The cell capacitor included in each memory cell MC may receive a capacitor voltage VCP.

The bit line sense amplification circuit 305 may receive the internal voltage VINT to perform an operation for sensing and amplifying levels of data loaded on bit lines BL.

Figure 15:
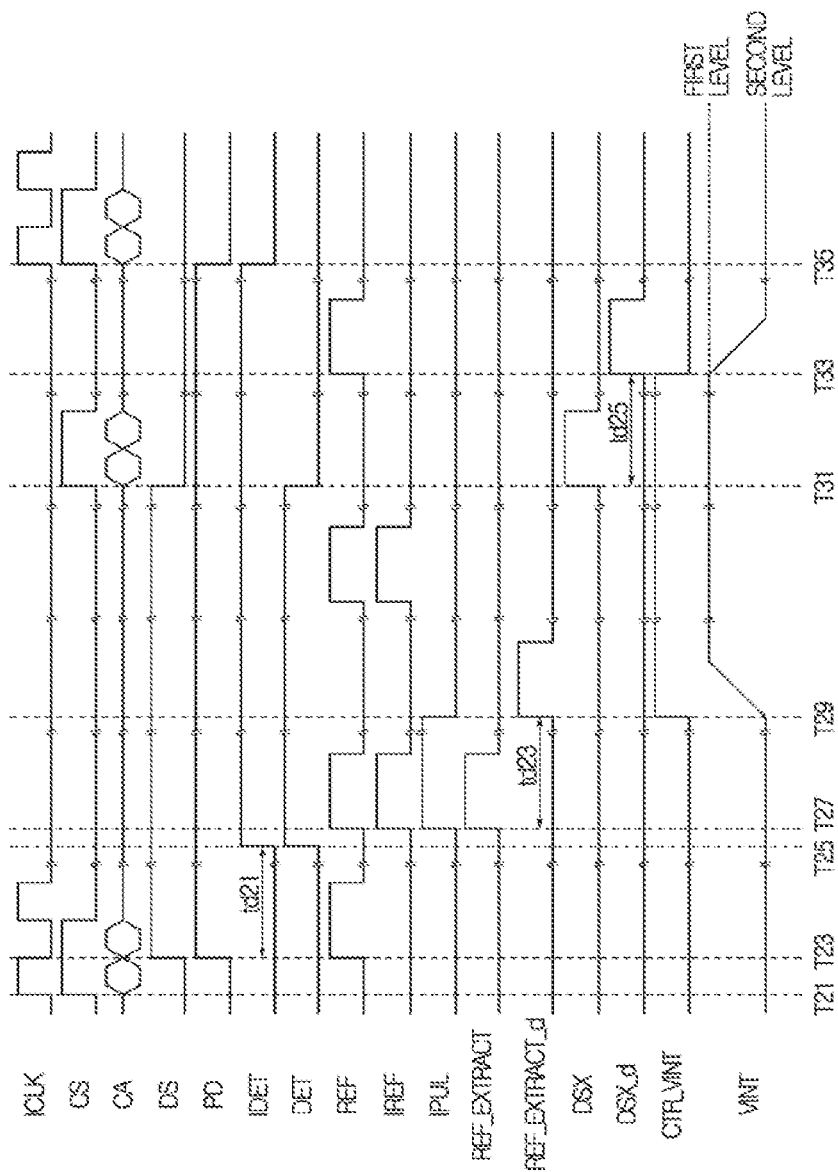
FIG. 15 is a timing diagram illustrating an operation that adjusts the level of an internal voltage during a self-refresh operation of the electronic device illustrated in FIG. 2.

FIG. 15 is a timing diagram illustrating an operation that adjusts the level of the internal voltage VINT during the self-refresh operation of the electronic device 120 illustrated in FIG. 2.

At a point in time "T21", the internal command generation circuit 201 may be synchronized with the internal clock signal (ICLK in FIG. 4) to generate the synthesis control command SREF_PDE, which is activated based on the chip selection signal CS and the command/address signal CA with a logic level combination to perform the self-refresh operation.

At a point in time "T23", the internal command generation circuit 201 may be synchronized with the internal clock signal (ICLK in FIG. 4) to generate the first mode entry command DSM, which is activated based on the command/address signal CA with a logic level combination for the first internal mode.

At the point in time "T23", the internal voltage control circuit 207 may generate the second mode signal (PD in FIG. 6), which is activated based on the synthesis control command SREF_PDE, which is activated at the point in time "T21". The internal voltage control circuit 207 may generate the first mode signal (DS in FIG. 6), which is activated based on the first mode entry command DSM, which is activated.

At a point in time "T25", the internal voltage control circuit 207 may generate the internal detection signal (IDET in FIG. 6), which is activated at a point in time when the second mode signal (PD in FIG. 6) is activated during the set operation period "td21". The internal voltage control circuit 207 may generate the detection signal (DET in FIG. 6), which is activated based on the activated internal detection signal (IDET in FIG. 6) and the activated first mode signal (DS in FIG. 6).

At a point in time "T27", the internal voltage control circuit 207 may activate the internal refresh signal (IREF in FIG. 10), the internal pulse signal (IPUL in FIG. 10), and the extraction refresh signal (REF_EXTRACT in FIG. 10) based on the activated detection signal (DET in FIG. 10) and the activated refresh signal (REF in FIG. 10).

At a point in time "T29", the internal voltage control circuit 207 may generate the delayed extraction refresh signal (REF_EXTRACT_d in FIG. 9) by delaying the extraction refresh signal (REF_EXTRACT in FIG. 9) by the first internal delay period "td23". The internal voltage control circuit 207 may activate the Internal voltage control signal CTR_VINT based on the delayed extraction refresh signal (REF_EXTRACT_d in FIG. 9) that is activated.

At the point in time "T29", the internal voltage generation circuit 209 may adjust the level of the Internal voltage VINT from the second level to the first level based on the activated internal voltage control signal CTR_VINT.

At a point in time "T31", the internal command generation circuit 201 may generate the first mode exit command DSX that terminates the first internal mode when the chip selection signal CS is activated.

At a point in time "T33", the internal voltage control circuit 207 may delay the first mode exit command DSX by the second internal delay period "td25" to generate the delayed mode exit command (DSX_d in FIG. 9). The internal voltage control circuit 207 may deactivate the internal voltage control signal CTR_VINT based on the delayed mode exit command (DSX_d in FIG. 9) that is activated.

At the point in time "T33", the internal voltage generation circuit 209 may adjust the level of the internal voltage VINT from the first level to the second level based on the deactivated internal voltage control signal CTR_VINT.

At a point in time "T35", the internal command generation circuit 201 may generate the second mode exit command PDX that terminates the second internal mode when the chip selection signal CS is activated.

Figure 16:
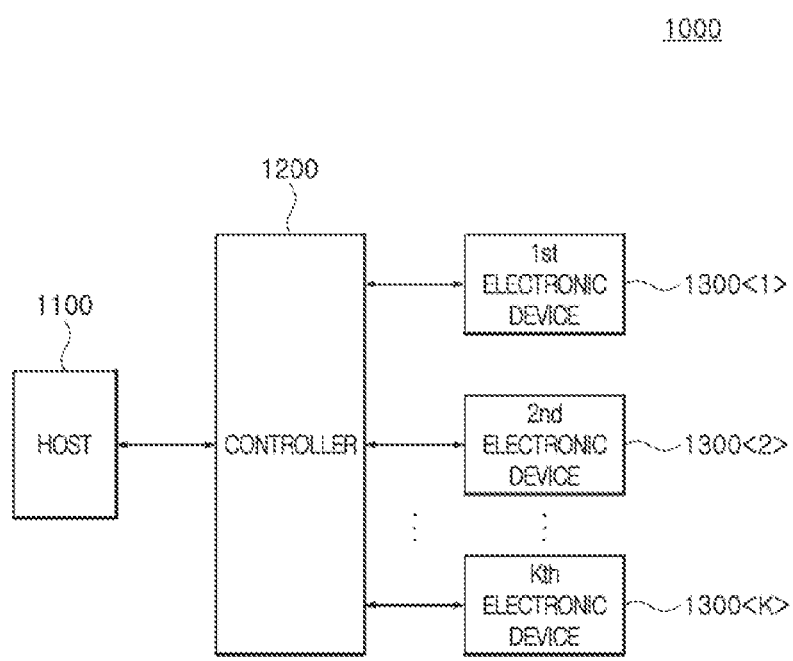
FIG. 16 is a block diagram illustrating a configuration of an electronic system according to another embodiment of the disclosed technology.

FIG. 16 is a block diagram illustrating a configuration of an electronic system 1000 according to another embodiment of the disclosed technology. As illustrated in FIG. 16, the electronic system 1000 may include a host 1100, a controller 1200, and first to $K^{th}$ electronic devices 1300<1:K> ("K" being a natural number that is equal to or greater than two). The controller 1200 may be realized by using the controller 110 included in the electronic system 100 illustrated in FIG. 1. Each of the first to $K^{th}$ electronic devices 1300<1:K> may be realized by using the electronic device 120 included in the electronic system 100 illustrated in FIG. 1.

The host 1100 and the controller 1200 may transmit signals to each other using an interface protocol. The interface protocol used for communication between the host 1100 and the controller 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The controller 1200 may control the first to $K^{th}$ electronic devices 1300<1:K> such that each of the first to $K^{th}$ electronic devices 1300<1:K> performs the self-refresh operation and the normal operation.

Each of the first to $K^{th}$ electronic devices 1300<1:K> may generate the internal voltage (VINT in FIG. 2) with one of different levels corresponding to respective internal temperature ranges during the self-refresh operation and may generate the internal voltage (VINT in FIG. 2) with a uniform level regardless of the internal temperature ranges during a normal operation. Thus, it may be possible to suppress or relieve a row hammer phenomenon and reduce current leakage in the electronic device. In addition, each of the first to $K^{th}$ electronic devices 1300<1:K> may adjust the level of the internal voltage (VINT in FIG. 2) when a deep sleep mode is executed during a period that is longer than a predetermined period while the self-refresh operation is being performed, thereby providing a sufficient time to recover the adjusted level of the internal voltage (VINT in FIG. 2) and reducing the amount of peak current that increases when the level of the internal voltage (VINT in FIG. 2) is repeatedly adjusted. Furthermore, each of the first to $K^{th}$ electronic devices 1300<1:K> may adjust the level of the internal voltage (VINT in FIG. 2) after a point in time when the refresh operation terminates while the self-refresh operation is being performed, thereby preventing an abnormal operation from being performed when the level of the internal voltage (VINT in FIG. 2) is adjusted during the refresh operation.

In some embodiments, each of the first to $K^{th}$ electronic devices 1300<1:K> may be realized by using one of a dynamic random access memory (DRAM), a phase change random access memory (PRAM), a resistive random access memory (RRAM), a magnetic random access memory (MRAM), and a ferroelectric random access memory (FRAM).

Figure 17:
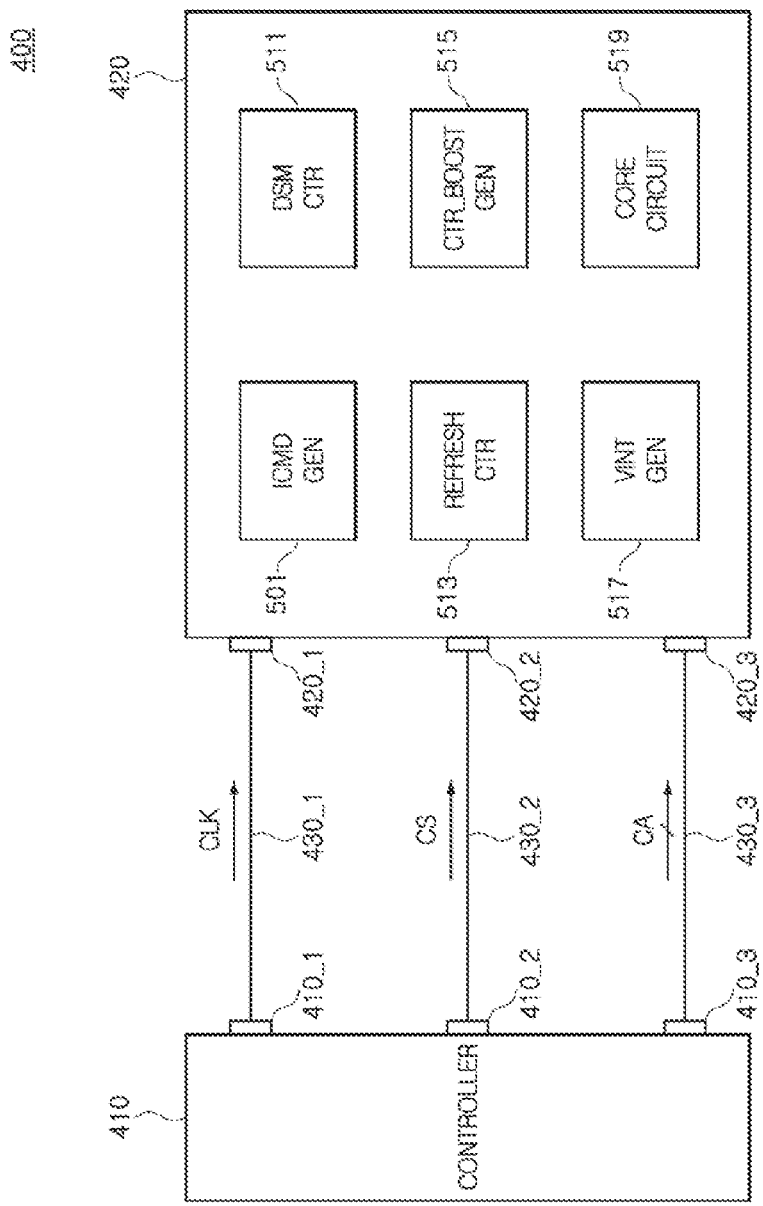
FIG. 17 is a block diagram illustrating a configuration of an electronic system according to another embodiment of the disclosed technology.

FIG. 17 is a block diagram illustrating a configuration of an electronic system 400 according to another embodiment of the present disclosure. As illustrated in FIG. 17, the electronic system 400 may include a controller 410 and an electronic device 420.

The controller 410 may include a first control pin 410_1, a second control pin 410_2, and a third control pin 410_3. The electronic device 420 may include a first device pin 420_1, a second device pin 420_2, and a third device pin 420_3. The controller 410 may transmit a clock signal CLK to the electronic device 420 through a first transmission line 430_1 that is coupled between the first control pin 410_1 and the first device pin 420_1. The controller 410 may transmit a chip selection signal CS to the electronic device 420 through a second transmission line 430_2 that is coupled between the second control pin 410_2 and the second device pin 420_2. The controller 410 may transmit a command address CA to the electronic device 420 through a third transmission line 430_3 that is coupled between the third control pin 410_3 and the third device pin 420_3. The number of bits of the command address CA may be variously set according to embodiments.

The electronic device 420 may include an internal command generation circuit (ICMD GEN) 501, an internal mode control circuit (DSM CTR) 511, a refresh control circuit (REFRESH CTR) 513, a boost control signal generation circuit (CTR_BOOST GEN) 515, an internal voltage generation circuit (VINT GEN) 517, and a core circuit (CORE CIRCUIT) 519. The electronic device 420 may be embodied as a semiconductor device. The electronic device 420 may receive the clock signal CLK, the chip selection signal CS, and the command address CA from the controller 410 and may perform a self-refresh operation or a normal operation. The normal operation may include various internal operations, such as a write operation, a read operation, and an active operation.

The internal command generation circuit 501 may generate a self-refresh command (SREF in FIG. 18) for performing a self-refresh operation and a mode entry command (DSM in FIG. 18) for performing an internal mode in the self-refresh operation based on the clock signal CLK, the chip selection signal CS and the command address CA. When an internal mode is performed in a self-refresh operation, the internal mode control circuit 511 may generate a burst control signal (CTR_BURST in FIG. 18), a blocking control signal (CTR_BLOCK in FIG. 18), and an internal voltage control signal (CTR_VINT in FIG. 2) based on a refresh cycle based on the mode entry command (DSM in FIG. 18). When the self-refresh operation is performed based on the self-refresh command (SREF in FIG. 18), the refresh control circuit 513 may generate a refresh signal (REF in FIG. 18) for performing a refresh operation every refresh cycle. When an internal mode is performed in a self-refresh operation, the refresh control circuit 513 may generate the refresh signal (REF in FIG. 18) every set cycle based on the burst control signal (CTR_BURST in FIG. 18). When an internal mode is performed in a self-refresh operation, the refresh control circuit 513 may block the generation of the refresh signal (REF in FIG. 18) based on the blocking control signal (CTR_BLOCK in FIG. 18). The boost control signal generation circuit 515 may generate a boost control signal CTR_BOOST depending on whether an internal mode is performed in a self-refresh operation based on the mode entry command (DSM in FIG. 18). The internal voltage generation circuit 517 may adjust the level of an internal voltage (VINT in FIG. 18) for a refresh operation based on the internal voltage control signal (CTR_VINT in FIG. 18) and the boost control signal (CTR_BOOST in FIG. 18). The core circuit 519 may receive the internal voltage (VINT in FIG. 18) and may perform a refresh operation based on the refresh signal (REF in FIG. 18).

Figure 18:
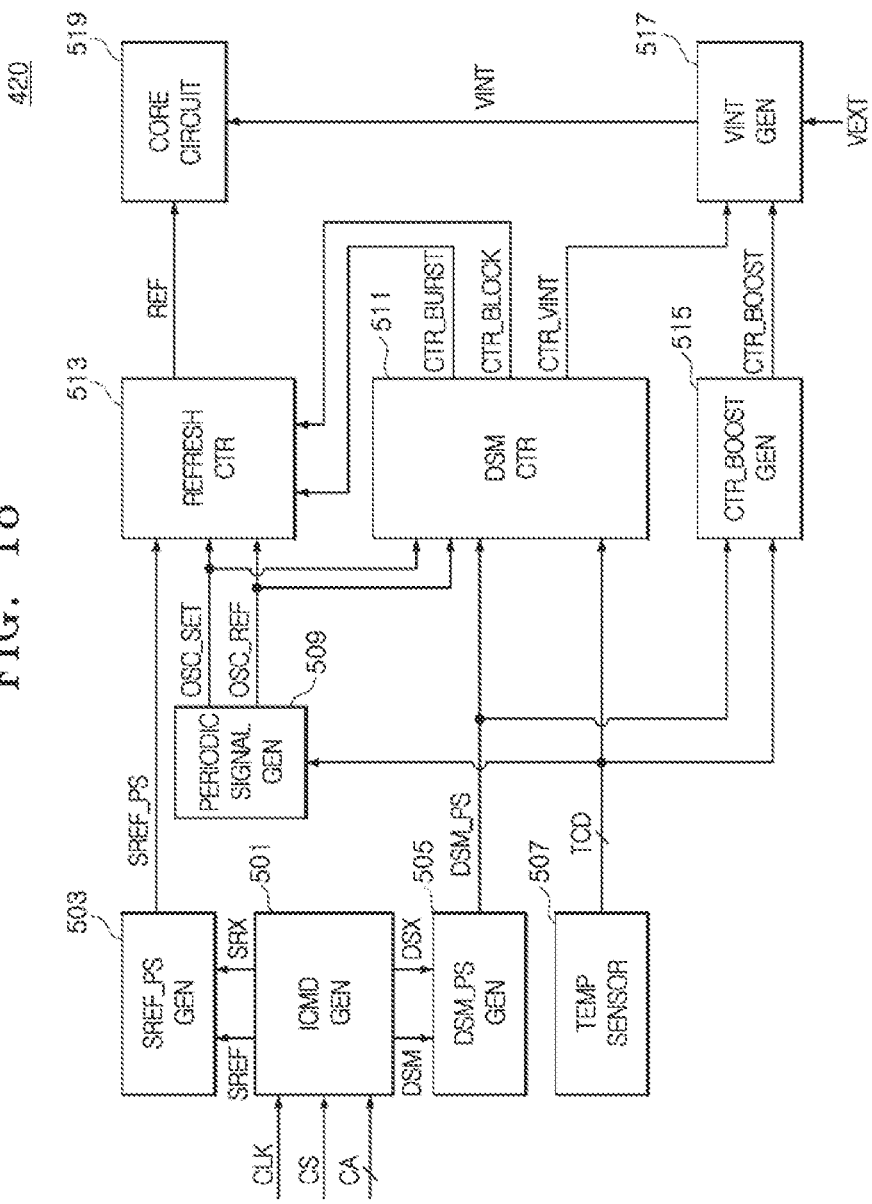
FIG. 18 is a block diagram illustrating a configuration of an electronic device included in the electronic system illustrated in FIG. 17.

FIG. 18 is a block diagram illustrating a configuration of the electronic device 420 included in the electronic system 400 illustrated in FIG. 17. As illustrated in FIG. 18, the electronic device 420 may include the internal command generation circuit (ICMD GEN) 501, a first period signal generation circuit (SREF_PS GEN) 503, a second period signal generation circuit (DSM_PS GEN) 505, a temperature sensing circuit (TEMP SENSOR) 507, a period signal generation circuit (PERIODIC SIGNAL GEN) 509, the internal mode control circuit (DSM CTR) 511, the refresh control circuit (REFRESH CTR) 513, the boost control signal generation circuit (CTR_BOOST GEN) 515, the internal voltage generation circuit (VINT GEN) 517, and the core circuit (CORE CIRCUIT) 519.

The internal command generation circuit 501 may generate a self-refresh command SREF, a self-refresh end command SRX, a mode entry command DSM, and a mode end command DSX based on a chip selection signal CS and a command address CA in synchronization with a clock signal CLK. The self-refresh command SREF may be activated when a self-refresh operation is performed. The self-refresh end command SRX may be activated when a self-refresh operation has ended. The mode entry command DSM may be activated when an internal mode is performed in a self-refresh operation. The mode end command DSX may be activated when an internal mode has ended in a self-refresh operation. An operating method of generating, by the internal command generation circuit 501, the self-refresh command SREF, the self-refresh end command SRX, the mode entry command DSM, and the mode end command DSX may be embodied identically with an operating method of generating, by the internal command generation circuit (201 in FIG. 2), the self-refresh command (SREF in FIG. 2), the self-refresh end command (SRX in FIG. 2), the first mode entry command (DSM in FIG. 2), and the first mode end command (DSX in FIG. 2).

The first period signal generation circuit 503 may generate a self-refresh period signal SREF_PS that is activated during a period in which a self-refresh operation is performed based on the self-refresh command SREF and the self-refresh end command SRX. The first period signal generation circuit 503 may activate the self-refresh period signal SREF_PS when the self-refresh command SREF is activated. The first period signal generation circuit 503 may deactivate the self-refresh period signal SREF_PS when the self-refresh end command SRX is activated.

The second period signal generation circuit 505 may generate an internal mode period signal DSM_PS that is activated during a period in which an internal mode is performed in a self-refresh operation based on the mode entry command DSM and the mode end command DSX. The second period signal generation circuit 505 may activate the internal mode period signal DSM_PS when the mode entry command DSM is activated. The second period signal generation circuit 505 may deactivate the internal mode period signal DSM_PS when the mode end command DSX is activated.

The temperature sensing circuit 507 may generate a temperature code TCD by sensing an internal temperature of the electronic device 420. The number of bits of the temperature code TCD may be variously set according to embodiments. The temperature code TCD may have a logic level combination corresponding to the internal temperature.

The period signal generation circuit 509 may generate a set cycle signal OSC_SET and a refresh cycle signal OSC_REF based on the temperature code TCD. The period signal generation circuit 509 may be supplied with power and may generate the set cycle signal OSC_SET that is activated every set cycle. The period signal generation circuit 509 may generate the refresh cycle signal OSC_REF that is activated every refresh cycle by dividing a frequency of the set cycle signal OSC_SET. That is, the set cycle may be set to be shorter than the refresh cycle. The period signal generation circuit 509 may adjust the refresh cycle of the refresh cycle signal OSC_REF according to a logic level combination of the temperature code TCD. For example, the period signal generation circuit 509 may shorten the refresh cycle of the refresh cycle signal OSC_REF as the internal temperature that is indicated by a logic level combination of the temperature code TCD becomes higher.

When an internal mode is performed in a self-refresh operation based on the internal mode period signal DSM_PS, the internal mode control circuit 511 may generate a burst control signal CTR_BURST, a blocking control signal CTR_BLOCK, and an internal voltage control signal CTR_VINT based on the temperature code TCD, the set cycle signal OSC_SET, and the refresh cycle signal OSC_REF. When an internal mode is performed in a self-refresh operation, the burst control signal CTR_BURST may be activated to control a refresh operation to be continuously performed at set cycle intervals of the set cycle signal OSC_SET. When an internal mode is performed in a self-refresh operation, the blocking control signal CTR_BLOCK may be activated to block the execution of a refresh operation. When an internal mode is performed in a self-refresh operation, the internal voltage control signal CTR_VINT may be activated to control the level of the internal voltage VINT to be low.

When an internal mode is performed in a self-refresh operation, the internal mode control circuit 511 may count the input of the refresh cycle signal OSC_REF that is activated every refresh cycle. The internal mode control circuit 511 may control the activation state of each of the burst control signal CTR_BURST, the blocking control signal CTR_BLOCK, and the internal voltage control signal CTR_VINT every refresh cycle by counting the input of the refresh cycle signal OSC_REF.

When an internal mode is performed in a self-refresh operation, the internal mode control circuit 511 may generate the burst control signal CTR_BURST based on the refresh cycle signal OSC_REF. When an internal mode is performed in a self-refresh operation, the internal mode control circuit 511 may generate the burst control signal CTR_BURST whenever a burst refresh cycle elapses. When an internal mode is performed in a self-refresh operation whenever the input of the refresh cycle signal OSC_REF is counted "N" times, the internal mode control circuit 511 may set a burst refresh cycle in which the burst control signal CTR_BURST is generated. A burst refresh cycle may be set as a multiple of "N" of the refresh cycle ("N" is a natural number equal to or greater than 3). For example, the internal mode control circuit 511 may generate the burst control signal CTR_BURST when counting the input of the refresh cycle signal OSC_REF "N" times in an internal mode and may generate the burst control signal CTR_BURST again when counting the input of the refresh cycle signal OSC_REF "2N" times.

When an internal mode is performed in a self-refresh operation whenever a burst refresh cycle elapses, the internal mode control circuit 511 may activate the burst control signal CTR_BURST based on the set cycle signal OSC_SET. When an internal mode is performed in a self-refresh operation, the internal mode control circuit 511 may count the input of the set cycle signal OSC_SET "N" times whenever a burst refresh cycle elapses. When an internal mode is performed in a self-refresh operation, the internal mode control circuit 511 may activate the burst control signal CTR_BURST whenever counting the input of the set cycle signal OSC_SET. The internal mode control circuit 511 may activate the burst control signal CTR_BURST within at least one refresh cycle whenever a burst refresh cycle elapses. For example, when counting the input of the refresh cycle signal OSC_REF "N" times in an internal mode, the internal mode control circuit 511 may activate the burst control signal CTR_BURST by counting the input of the set cycle signal OSC_SET "N" times within one refresh cycle.

When an internal mode is performed in a self-refresh operation, the internal mode control circuit 511 may generate the blocking control signal CTR_BLOCK based on the refresh cycle signal OSC_REF. When a burst refresh cycle elapses in an internal mode, the internal mode control circuit 511 may activate the blocking control signal CTR_BLOCK every refresh cycle until a next burst refresh cycle elapses from a point in time at which at least one refresh cycle in which the burst control signal CTR_BURST is activated elapses. For example, the internal mode control circuit 511 may activate the burst control signal CTR_BURST when counting the input of the refresh cycle signal OSC_REF "N" times in an internal mode and may activate the blocking control signal CTR_BLOCK when counting the input of the refresh cycle signal OSC_REF "N+1" to "2N−1" times.

When an internal mode is performed in a self-refresh operation, the internal mode control circuit 511 may generate the internal voltage control signal CTR_VINT based on the refresh cycle signal OSC_REF. When a burst refresh cycle elapses in an Internal mode, the internal mode control circuit 511 may activate the internal voltage control signal CTR_VINT from a point in time at which at least one refresh cycle in which the burst control signal CTR_BURST is activated elapses. For example, the internal mode control circuit 511 may activate the burst control signal CTR_BURST when counting the input of the refresh cycle signal OSC_REF "N" times in an internal mode and may activate the internal voltage control signal CTR_VINT from a point in time at which the input of the refresh cycle signal OSC_REF is counted "N+1" times. Accordingly, when an internal mode is performed in a self-refresh operation, the internal mode control circuit 511 can reduce standby power consumption in the internal mode by adjusting the level of the internal voltage VINT in a period in which the execution of a refresh operation is blocked after the refresh operation is continuously performed.

When a burst refresh cycle elapses in an internal mode, the internal mode control circuit 511 may deactivate the internal voltage control signal CTR_VINT, ahead of at least one refresh cycle, earlier than a point in time at which a next burst refresh cycle elapses. For example, the Internal mode control circuit 511 may deactivate the internal voltage control signal CTR_VINT when counting the input of the refresh cycle signal OSC_REF "2N−1" times and may activate the burst control signal CTR_BURST when counting the input of the refresh cycle signal OSC_REF "2N" times. Accordingly, the internal mode control circuit 511 restores, to its original level, the level of the internal voltage VINT that is adjusted before a refresh operation is continuously performed in an internal mode, so that a continuous refresh operation can be stably performed in the internal mode.

When an internal mode has ended in a self-refresh operation, the internal mode control circuit 511 may deactivate the burst control signal CTR_BURST. When an internal mode has ended in a self-refresh operation, the internal mode control circuit 511 may deactivate the internal voltage control signal CTR_VINT. When an internal mode has ended in the state in which the internal voltage control signal CTR_VINT has been deactivated, the internal mode control circuit 511 may deactivate the blocking control signal CTR_BLOCK. When an internal mode has ended in the state in which the internal voltage control signal CTR_VINT has been activated, the internal mode control circuit 511 may activate the blocking control signal CTR_BLOCK at least once by counting the input of the refresh cycle signal OSC_REF at least once. Accordingly, when an internal mode has ended in the state in which the level of the internal voltage VINT has been adjusted, the internal mode control circuit 511 may block the execution of a refresh operation until the level of the internal voltage VINT has returned to its original level, so that a refresh operation that is performed after the internal mode has ended can be stably performed.

When an internal mode is performed in a self-refresh operation, if an internal temperature that is indicated by a logic level combination of the temperature code TCD corresponds to a preset first temperature section, the internal mode control circuit 511 may generate the burst control signal CTR_BURST, the blocking control signal CTR_BLOCK, and the internal voltage control signal CTR_VINT. When the refresh cycle, varying depending on an internal temperature, is equal to or greater than "N" times of a set cycle, the first temperature section may be set as a section of the corresponding internal temperature.

As described above, when an internal mode is performed in a self-refresh operation, the internal mode control circuit 511 may determine the activation state of each of the burst control signal CTR_BURST, the blocking control signal CTR_BLOCK, and the internal voltage control signal CTR_VINT whenever the refresh cycle elapses. Accordingly, a refresh operation can be stably performed, and standby power can also be reduced in the internal mode. A more detailed configuration and operation of the internal mode control circuit 511 are described later with reference to FIG. 19.

The refresh control circuit 513 may generate a refresh signal REF from the set cycle signal OSC_SET and the refresh cycle signal OSC_REF based on the self-refresh period signal SREF_PS, the burst control signal CTR_BURST, and the blocking control signal CTR_BLOCK. The refresh signal REF may be activated in order to perform a refresh operation. When the burst control signal CTR_BURST and the blocking control signal CTR_BLOCK are deactivated during a period in which a self-refresh operation is performed based on the self-refresh period signal SREF_PS, the refresh control circuit 513 may activate the refresh signal REF every refresh cycle of the refresh cycle signal OSC_REF. When the burst control signal CTR_BURST is activated during a period in which a self-refresh operation is performed based on the self-refresh period signal SREF_PS, the refresh control circuit 513 may activate the refresh signal REF every set cycle of the set cycle signal OSC_SET. For example, when an internal mode is performed in a self-refresh operation, the refresh control circuit 513 may activate the refresh signal REF "N" times at set cycle intervals based on the burst control signal CTR_BURST whenever a burst refresh cycle elapses. When the blocking control signal CTR_BLOCK is activated during a period in which a self-refresh operation is performed based on the self-refresh period signal SREF_PS, the refresh control circuit 513 may block the generation of the refresh signal REF. For example, when a burst refresh cycle elapses in an internal mode, the refresh control circuit 513 may block the generation of the refresh signal REF "N−1" times based on the blocking control signal CTR_BLOCK, until a next burst refresh cycle elapses from a point in time at which one refresh cycle in which the burst control signal CTR_BURST is activated elapses. A more detailed configuration and operation of the refresh control circuit 513 are described later with reference to FIG. 20.

The boost control signal generation circuit 515 may generate a boost control signal CTR_BOOST based on the temperature code TCD and the internal mode period signal DSM_PS. When the internal mode period signal DSM_PS is deactivated and an internal temperature that is indicated by a logic level combination of the temperature code TCD corresponds to a preset second temperature section, the boost control signal generation circuit 515 may activate the boost control signal CTR_BOOST. The second temperature section may be variously set according to embodiments. When an internal temperature corresponds to the preset second temperature section, the boost control signal CTR_BOOST may be activated in order to adjust the level of the internal voltage VINT to be high so that a normal operation is stably performed. During a period in which an internal mode is performed in a self-refresh operation, the boost control signal generation circuit 515 may deactivate the boost control signal CTR_BOOST based on the internal mode period signal DSM_PS. The boost control signal CTR_BOOST may be deactivated in order to adjust the level of the internal voltage VINT to be low during a period in which an internal mode is performed in a self-refresh operation. Accordingly, during a period in which an internal mode is performed in a self-refresh operation, the boost control signal generation circuit 515 may lower the level of the internal voltage VINT set to be high so that a normal operation is stably performed, which makes it possible to reduce power consumption during the period in which the internal mode is performed.

The internal voltage generation circuit 517 may generate an internal voltage VINT by using an external voltage VEXT that is supplied thereto based on the internal voltage control signal CTR_VINT and the boost control signal CTR_BOOST. The internal voltage generation circuit 517 may adjust the level of the internal voltage VINT according to the activation state of each of the internal voltage control signal CTR_VINT and the boost control signal CTR_BOOST. More specifically, when the boost control signal CTR_BOOST is activated, the internal voltage generation circuit 517 may generate the internal voltage VINT with a first level. When both the boost control signal CTR_BOOST and the internal voltage control signal CTR_VINT are deactivated, the internal voltage generation circuit 517 may generate the internal voltage VINT with a second level lower than the first level. When the internal voltage control signal CTR_VINT is activated, the internal voltage generation circuit 517 may generate the internal voltage VINT with a third level lower than the second level. In the present embodiment, each of the first level, second level and third level of the internal voltage VINT may be set as a level with a positive voltage. A more detailed configuration and operation of the internal voltage generation circuit 517 are described later with reference to FIG. 21.

The core circuit 519 may perform a refresh operation based on the refresh signal REF by using the internal voltage VINT that is supplied thereto. The core circuit 519 may perform a refresh operation of sensing and amplifying data that is stored in a memory cell array (553 in FIG. 22) whenever the refresh signal REF is activated. A more detailed configuration and operation of the core circuit 519 are described later with reference to FIG. 22.

Figure 19:
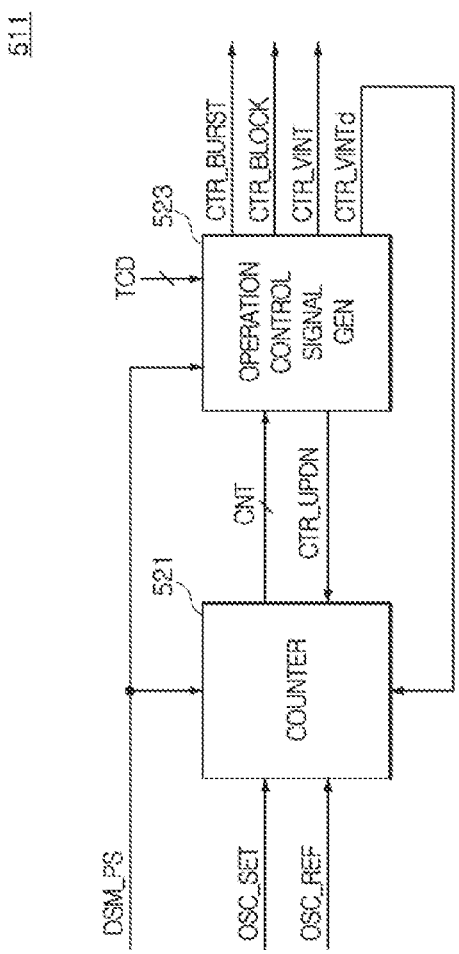
FIG. 19 is a block diagram illustrating a configuration of an internal mode control circuit included in the electronic device illustrated in FIG. 18.

FIG. 19 is a block diagram illustrating a configuration of the internal mode control circuit 511 included in the electronic device 420 illustrated in FIG. 18. As illustrated in FIG. 19, the internal mode control circuit 511 may include a count circuit (COUNTER) 521 and an operation control signal generation circuit (OPERATION CONTROL SIGNAL GEN) 523.

The count circuit 521 may generate a count signal CNT by counting the inputs of the set cycle signal OSC_SET and the refresh cycle signal OSC_REF based on the internal mode period signal DSM_PS, a delay internal-voltage control signal CTR_VINTd, and an up-down control signal CTR_UPDN. The delay internal-voltage control signal CTR_VINTd may be generated by delaying the internal voltage control signal CTR_VINT. A combination of the count signals CNT may each correspond to initial values "0" to "N." A combination of the count signals CNT may correspond to the initial value "0" upon initialization operation. The up-down control signal CTR_UPDN may have a first logic level for performing an up-counting operation when a combination of the count signals CNT corresponds to the initial value "0." The up-down control signal CTR_UPDN may have a second logic level for performing a down-counting operation when a combination of the count signals CNT corresponds to "N." The first logic level and the second logic level may be set as a logic high level and a logic low level, respectively. In some embodiments, the first logic level and the second logic level may be set as a logic low level and a logic high level, respectively.

The count circuit 521 may generate the count signal CNT by counting the input of one of the set cycle signal OSC_SET and the refresh cycle signal OSC_REF according to a logic level of the up-down control signal CTR_UPDN in a period in which the internal mode period signal DSM_PS is activated. More specifically, when the up-down control signal CTR_UPDN has the first logic level in the period in which the internal mode period signal DSM_PS is activated, the count circuit 521 may increase a value corresponding to a combination of the count signals CNT by "1" by up-counting the input of the set cycle signal OSC_SET. When the up-down control signal CTR_UPDN has the second logic level in the period in which the internal mode period signal DSM_PS is activated, the count circuit 521 may decrease a value corresponding to a combination of the count signals CNT by "1" by down-counting the input of the refresh cycle signal OSC_REF. When the internal mode period signal DSM_PS is deactivated in a period in which the delay internal-voltage control signal CTR_VINTd is activated, the count circuit 521 may decrease a value corresponding to a combination of the count signals CNT by down-counting the input of the refresh cycle signal OSC_REF at least once based on the up-down control signal CTR_UPDN with the second logic level. That is, when an internal mode has ended in the state in which the internal voltage control signal CTR_VINT has been activated, the count circuit 521 may decrease a value corresponding to a combination of the count signals CNT by down-counting the input of the refresh cycle signal OSC_REF at least once.

The operation control signal generation circuit 523 may generate the up-down control signal CTR_UPDN, the burst control signal CTR_BURST, the blocking control signal CTR_BLOCK, the internal voltage control signal CTR_VINT, and the delay internal-voltage control signal CTR_VINTd according to a combination of the count signals CNT based on the temperature code TCD and the internal mode period signal DSM_PS.

When an internal temperature indicated by a logic level combination of the temperature code TCD corresponds to a first temperature section, the operation control signal generation circuit 523 may generate the up-down control signal CTR_UPDN, the burst control signal CTR_BURST, the blocking control signal CTR_BLOCK, the internal voltage control signal CTR_VINT, and the delay internal-voltage control signal CTR_VINTd according to a combination of the count signals CNT in a period in which the internal mode period signal DSM_PS is activated.

When a combination of the count signals CNT corresponds to the initial value "0", the operation control signal generation circuit 523 may set a logic level of the up-down control signal CTR_UPDN as the first logic level for an up-counting operation. When a combination of the count signals CNT corresponds to "N", the operation control signal generation circuit 523 may set a logic level of the up-down control signal CTR_UPDN as the second logic level for a down-counting operation.

When the up-down control signal CTR_UPDN has the first logic level, the operation control signal generation circuit 523 may generate the burst control signal CTR_BURST according to a combination of the count signals CNT. For example, when a combination of the count signals CNT corresponds to "1" to "N" in the state in which the up-down control signal CTR_UPDN has the first logic level, the operation control signal generation circuit 523 may activate the burst control signal CTR_BURST.

When the up-down control signal CTR_UPDN has the second logic level, the operation control signal generation circuit 523 may generate the blocking control signal CTR_BLOCK and the internal voltage control signal CTR_VINT according to a combination of the count signals CNT. For example, when a combination of the count signals CNT corresponds to "N−1" to "1" in the state in which the up-down control signal CTR_UPDN has the second logic level, the operation control signal generation circuit 523 may activate the blocking control signal CTR_BLOCK. The operation control signal generation circuit 523 may activate the internal voltage control signal CTR_VINT during a period in which a combination of the count signals CNT corresponds to "N−1" to "2" in the state in which the up-down control signal CTR_UPDN has the second logic level. The operation control signal generation circuit 523 may generate the delay internal-voltage control signal CTR_VINTd by delaying the internal voltage control signal CTR_VINT by a set period.

Figure 20:
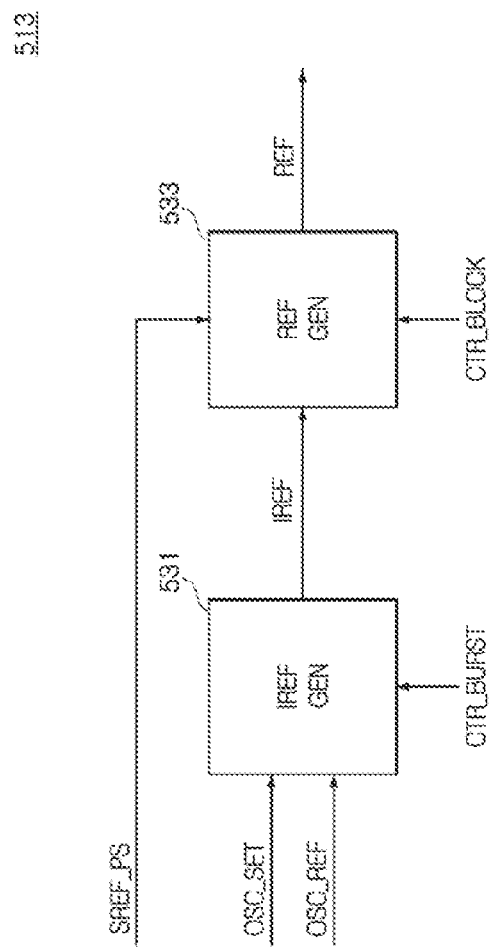
FIG. 20 is a block diagram illustrating a configuration of a refresh control circuit included in the electronic device illustrated in FIG. 18.

FIG. 20 is a block diagram illustrating a configuration of the refresh control circuit 513 included in the electronic device 420 illustrated in FIG. 18. As illustrated in FIG. 20, the refresh control circuit 513 may include an internal refresh signal generation circuit (IREF GEN) 531 and a refresh signal generation circuit (REF GEN) 533.

The internal refresh signal generation circuit 531 may generate an internal refresh signal IREF from one of the set cycle signal OSC_SET and the refresh cycle signal OSC_REF based on the burst control signal CTR_BURST. More specifically, when the burst control signal CTR_BURST is activated, the internal refresh signal generation circuit 531 may output the set cycle signal OSC_SET as the internal refresh signal IREF. When the burst control signal CTR_BURST is deactivated, the internal refresh signal generation circuit 531 may output the refresh cycle signal OSC_REF as the internal refresh signal IREF.

The refresh signal generation circuit 533 may generate the refresh signal REF from the internal refresh signal IREF based on the self-refresh period signal SREF_PS and the blocking control signal CTR_BLOCK. More specifically, when the blocking control signal CTR_BLOCK is deactivated in a period in which the self-refresh period signal SREF_PS is activated, the refresh signal generation circuit 533 may output the internal refresh signal IREF as the refresh signal REF. When the blocking control signal CTR_BLOCK is activated in the period in which the self-refresh period signal SREF_PS is activated, the refresh signal generation circuit 533 may block the generation of the refresh signal REF from the internal refresh signal IREF.

Figure 21:
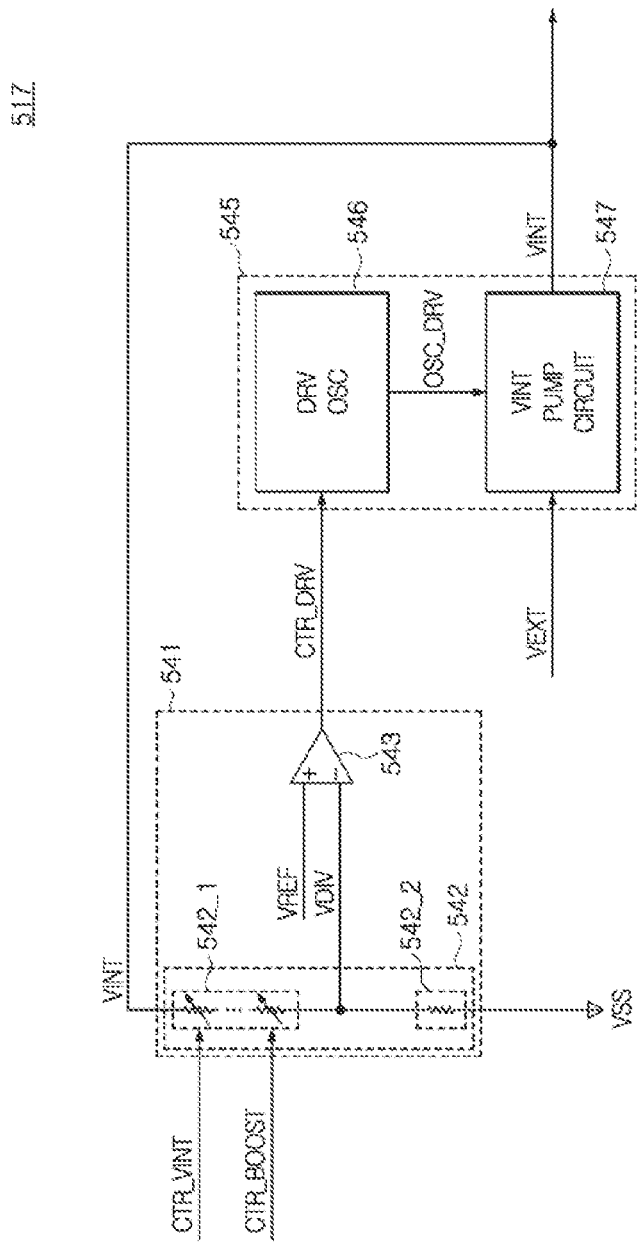
FIG. 21 illustrates an example of an internal voltage generation circuit included in the electronic device illustrated in FIG. 18.

FIG. 21 is a diagram illustrating a configuration of the internal voltage generation circuit 517 included in the electronic device 420 illustrated in FIG. 18. As illustrated in FIG. 21, the internal voltage generation circuit 517 may include a drive control signal generation circuit 541 and an internal voltage driving circuit 545.

The drive control signal generation circuit 541 may include a voltage division circuit 542 and a comparison circuit 543. The drive control signal generation circuit 541 may generate a drive control signal CTR_DRV by sensing the level of the internal voltage VINT based on the internal voltage control signal CTR_VINT and the boost control signal CTR_BOOST.

The voltage division circuit 542 may include a variable resistive circuit 542_1 and a resistive element 542_2. The voltage division circuit 542 may generate a division voltage VDIV by dividing the voltage difference between the internal voltage VINT and a ground voltage VSS based on the resistance value of the variable resistive circuit 542_1 and the resistance value of the resistive element 542_2. The ground voltage VSS may be applied from a power pad (not illustrated). The voltage division circuit 542 may adjust the resistance value of the variable resistive circuit 542_1 based on the internal voltage control signal CTR_VINT and the boost control signal CTR_BOOST. For example, the voltage division circuit 542 may adjust the resistance value of the variable resistive circuit 542_1 to a first resistance value in a period in which the internal voltage control signal CTR_VINT is activated. The voltage division circuit 542 may adjust the resistance value of the variable resistive circuit 542_1 to a second resistance value in a period in which the boost control signal CTR_BOOST is activated.

The comparison circuit 543 may generate the drive control signal CTR_DRV by comparing the level of the division voltage VDIV with the level of a reference voltage VREF. For example, when the level of the division voltage VDIV is the level of the reference voltage VREF or less, the comparison circuit 543 may generate the drive control signal CTR_DRV with the first logic level. When the level of the division voltage VDIV is higher than the level of the reference voltage VREF, the comparison circuit 543 may generate the drive control signal CTR_DRV with the second logic level. The drive control signal output circuit 543 may be embodied as a differential amplifier.

The internal voltage driving circuit 545 may include a drive oscillation signal generation circuit (DRV OSC) 546 and an internal voltage pump circuit (VINT PUMP CIRCUIT) 547. The internal voltage driving circuit 545 may generate the internal voltage VINT from the external voltage VEXT based on the drive control signal CTR_DRV. When the drive control signal CTR_DRV has the first logic level, the internal voltage driving circuit 545 may raise the level of the internal voltage VINT. When the drive control signal CTR_DRV has the second logic level, the internal voltage driving circuit 213 may lower the level of the internal voltage VINT.

The drive oscillation signal generation circuit 546 may generate a drive oscillation signal OSC_DRV based on the drive control signal CTR_DRV. The drive oscillation signal generation circuit 546 may generate the drive oscillation signal OSC_DRV that toggles when the drive control signal CTR_DRV has the first logic level. The drive oscillation signal generation circuit 546 may generate the drive oscillation signal OSC_DRV that does not toggle when the drive control signal CTR_DRV has the second logic level.

The internal voltage pump circuit 547 may generate the internal voltage VINT from the external voltage VEXT based on the drive oscillation signal OSC_DRV. When the drive oscillation signal OSC_DRV toggles, the internal voltage pump circuit 547 may drive the level of the internal voltage VINT to be high based on the external voltage VEXT. When the drive oscillation signal OSC_DRV does not toggle, the internal voltage pump circuit 547 may drive the level of the internal voltage VINT to be low based on the external voltage VEXT.

Figure 22:
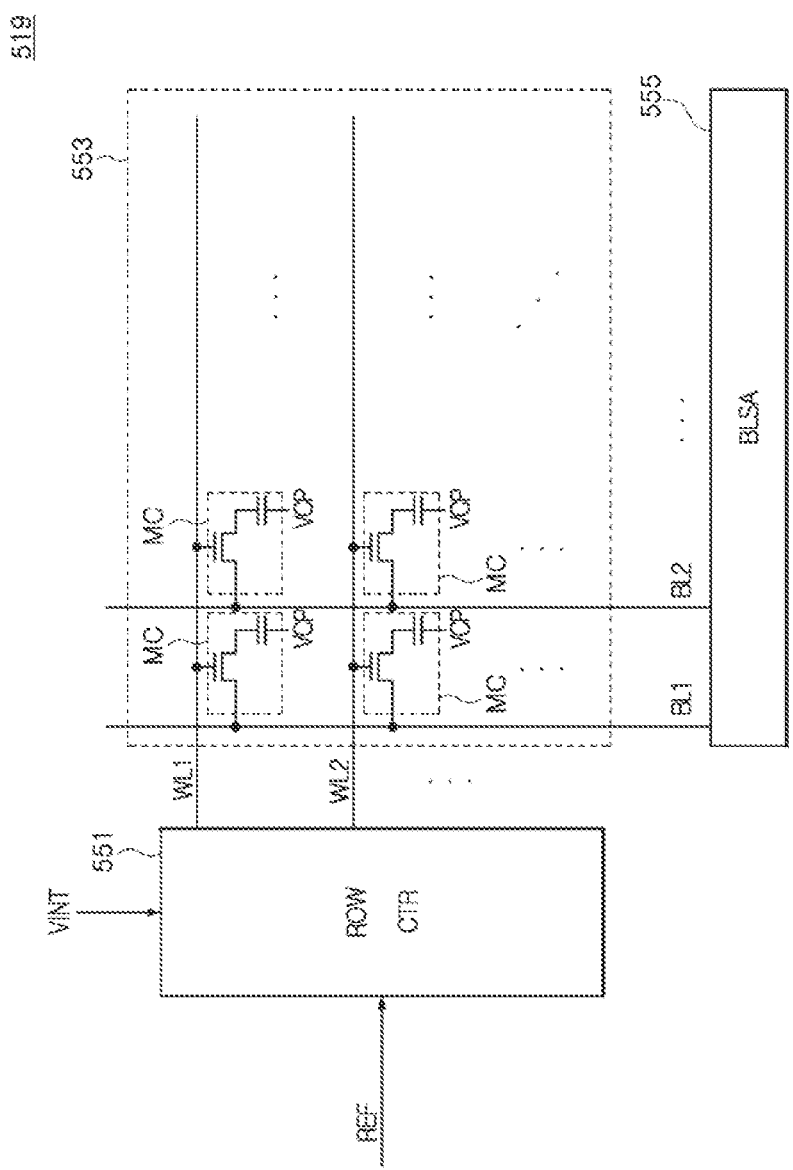
FIG. 22 illustrates an example of a core circuit included in the electronic device illustrated in FIG. 18.

FIG. 22 is a diagram illustrating a configuration of the core circuit 519 included in the electronic device 420 illustrated in FIG. 18. As illustrated in FIG. 22, the core circuit 519 may include a row control circuit (ROW CTR) 551, the memory cell array 553 and a bit line sense amplifier (BLSA) 555.

The row control circuit 551 may activate one of word lines WL based on the refresh signal REF by using the internal voltage VINT supplied thereto. The internal voltage VINT may be supplied as a voltage for activating the word lines WL. The row control circuit 551 may sequentially activate the word lines WL whenever the refresh signal REF is activated. For example, the row control circuit 551 may activate a first word line WL1 when the refresh signal REF is activated for the first time and may activate a second word line WL2 when the refresh signal REF is activated for the second time.

The memory cell array 553 may include multiple memory cells MC. Each of the memory cells MC may include a cell transistor and a cell capacitor. The cell transistor that is included in the memory cell MC may store data in the cell capacitor that is included in the memory cell MC or output data that is stored therein. The cell capacitor that is included in the memory cell MC may be supplied with a capacitor voltage VCP.

The bit line sense amplifier 555 may perform an operation of sensing and amplifying data loaded on a bit line BL.

Figure 23:
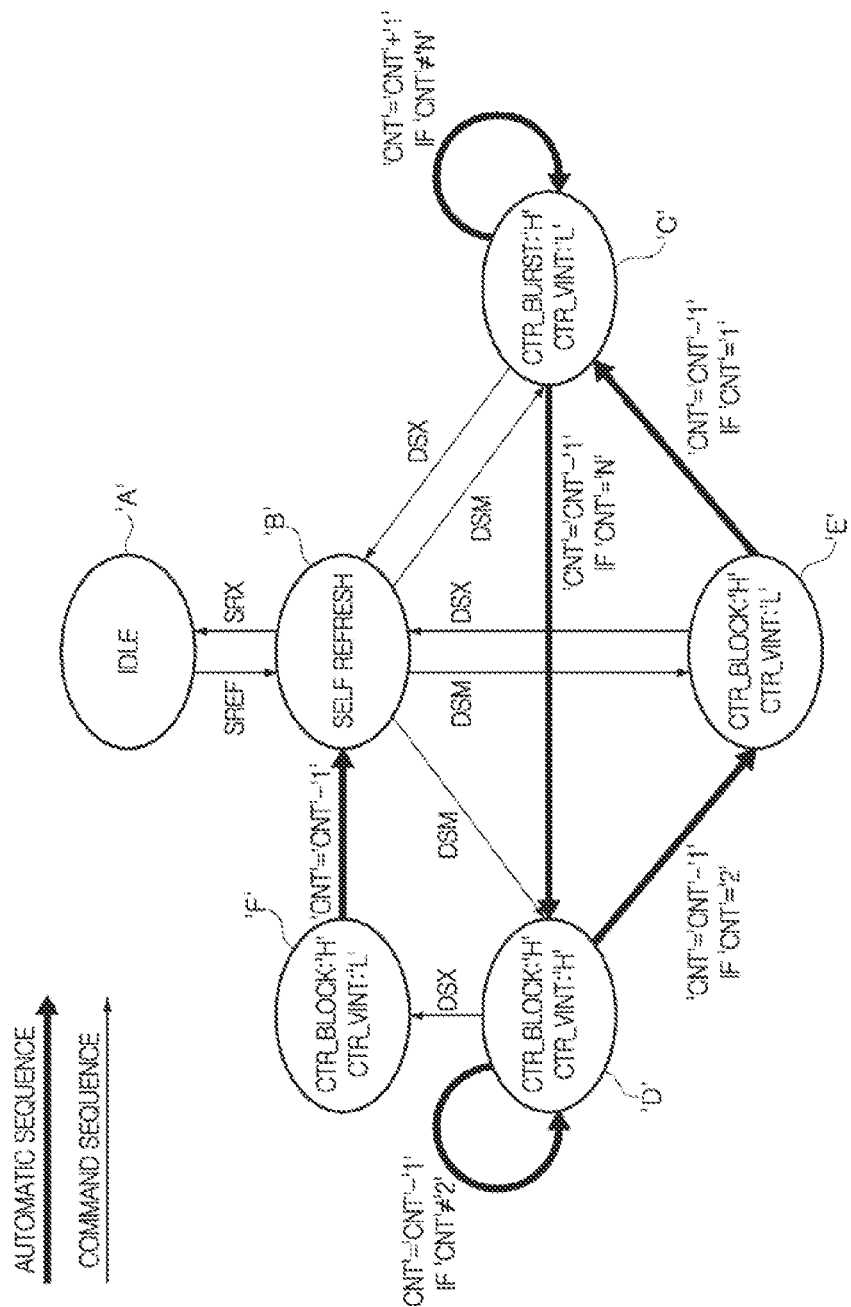
FIG. 23 is a state diagram for describing an operation of the electronic device illustrated in FIG. 18.

FIG. 23 is a state diagram for describing an operation of the electronic device 420 illustrated in FIG. 18. Referring to FIG. 23, the electronic device 420 may be in one of states "A", "B", "C", "D", "E", and "F" depending on whether a self-refresh operation is performed, depending on whether an internal mode is performed in a self-refresh operation and depending on whether a refresh cycle and a set cycle have elapsed. A state of the electronic device 420 may shift in response to one of a command sequence ("COMMAND SEQUENCE") and an automatic sequence ("AUTOMATIC SEQUENCE"). The command sequence ("COMMAND SEQUENCE") means a sequence based on a command, such as the self-refresh entry command SREF, the self-refresh end command SRX, the internal mode entry command DSM, or the internal mode end command DSX. The automatic sequence ("AUTOMATIC SEQUENCE") means a sequence based on a lapse of time, such as a refresh cycle or a set cycle.

The state "A" indicates an idle state in which a self-refresh operation and a normal operation are not performed. The state "B" indicates a state in which a refresh operation is performed every refresh cycle in a self-refresh operation in which an internal mode is not performed. The state "C" indicates the state in which when an internal mode is performed in a self-refresh operation, a logic level of the burst control signal CTR_BUSRT for continuously performing a refresh operation at set cycle intervals is activated to a logic high level ("H") and a logic level of the internal voltage control signal CTR_VINT for lowering the level of the internal voltage VINT is deactivated to a logic low level ("L"). The state "D" indicates a state in which when an internal mode is performed in a self-refresh operation, the logic level of the blocking control signal CTR_BLOCK for blocking the execution of a refresh operation is activated to a logic high level ("H") and the logic level of the internal voltage control signal CTR_VINT is activated to a logic high level ("H"). The state "E" indicates a state in which when an internal mode is performed in a self-refresh operation, the logic level of the blocking control signal CTR_BLOCK is activated to a logic high level ("H") and a logic level of the internal voltage control signal CTR_VINT is deactivated to a logic high level ("L"). The state "F" indicates the state in which when an internal mode has ended in the state in which the logic level of the internal voltage control signal CTR_VINT has been activated to a logic high level ("H"), the logic level of the blocking control signal CTR_BLOCK is activated to a logic high level ("H"), and the logic level of the internal voltage control signal CTR_VINT is deactivated to a logic high level ("L").

The electronic device 420 may be in the state "A" before entering a self-refresh operation. The electronic device 420 may shift from the state "A" to the state "B" in which a self-refresh operation is performed, based on the self-refresh entry command SREF. The electronic device 420 may shift from the state "B" to the state "A" based on the self-refresh end command SRX.

When entering an internal mode in a self-refresh operation based on the internal mode entry command DSM, the electronic device 420 may shift from the state "B" to one of the states "C", "D", and "E" according to a combination of the count signals (CNT in FIG. 19) that is indicative of a lapse of a refresh cycle and a set cycle and a logic level of the up-down control signal (CTR_UPDN in FIG. 19).

The electronic device 420 may increase the value corresponding to a combination of the count signals CNT by "1" until the value corresponding to the combination of the count signals (CNT in FIG. 19) corresponds to "N" by up-counting the input of the set cycle signal OSC_SET based on the up-down control signal (CTR_UPDN in FIG. 19) with the first logic level for an up-counting operation in the state "C." The electronic device 420 may maintain the state "C" until the value corresponding to the combination of the count signals CNT corresponds to "N." The value corresponding to the combination of the count signals CNT may be set as the initial value "0" upon initialization operation.

When a combination of the count signals (CNT in FIG. 19) corresponds to "N", the electronic device 420 may change the logic level of the up-down control signal (CTR_UPDN in FIG. 19) from the first logic level to the second logic level for a down-counting operation. The electronic device 420 may decrease the value corresponding to a combination of the count signals CNT from "N" to "N−1" by down-counting the input of the refresh cycle signal OSC_REF based on the up-down control signal CTR_UPDN with the second logic level for a down-counting operation. Accordingly, the electronic device 420 may shift from the state "C" to the state "D."

The electronic device 420 may decrease the value corresponding to a combination of the count signals CNT by "1" until the value corresponding to the combination of the count signals (CNT in FIG. 19) corresponds to "2" by down-counting the input of the refresh cycle signal OSC_REF based on the up-down control signal (CTR_UPDN in FIG. 19) with the second logic level for a down-counting operation in the state "D." The electronic device 420 may maintain the state "D" until the value corresponding to the combination of the count signals CNT corresponds to "2."

The electronic device 420 may decrease the value corresponding to a combination of the count signals (CNT in FIG. 19) from "2" to "1" by down-counting the input of the refresh cycle signal OSC_REF based on the up-down control signal (CTR_UPDN in FIG. 19) with the second logic level for a down-counting operation. Accordingly, the electronic device 420 may shift from the state "D" to the state "E."

The electronic device 420 may decrease the value corresponding to a combination of the count signals (CNT in FIG. 19) from "1" to the initial value "0" by down-counting the input of the refresh cycle signal OSC_REF based on the up-down control signal (CTR_UPDN in FIG. 19) with the second logic level for a down-counting operation in the state "E." When the value corresponding to a combination of the count signals CNT corresponds to the initial value "0", the electronic device 420 may change a logic level of the up-down control signal CTR_UPDN from the second logic level to the first logic level for an up-counting operation. Accordingly, the electronic device 420 may shift from the state "E" to the state "C."

The electronic device 420 may shift to the state "B" when an internal mode has ended in a self-refresh operation based on the internal mode end command DSX in the state "C." When an internal mode has ended in a self-refresh operation based on the internal mode end command DSX in the state "D", the electronic device 420 may shift to the state "F." The electronic device 420 may shift to the state "B" by decreasing at least one value corresponding to a combination of the count signals (CNT in FIG. 19) in a way to down-count the input of the refresh cycle signal OSC_REF at least once based on the up-down control signal (CTR_UPDN in FIG. 19) with the second logic level for a down-counting operation in the state "F." When an internal mode has ended in a self-refresh operation based on the internal mode end command DSX in the state "E", the electronic device 420 may shift to the state "B.".

Figure 24:
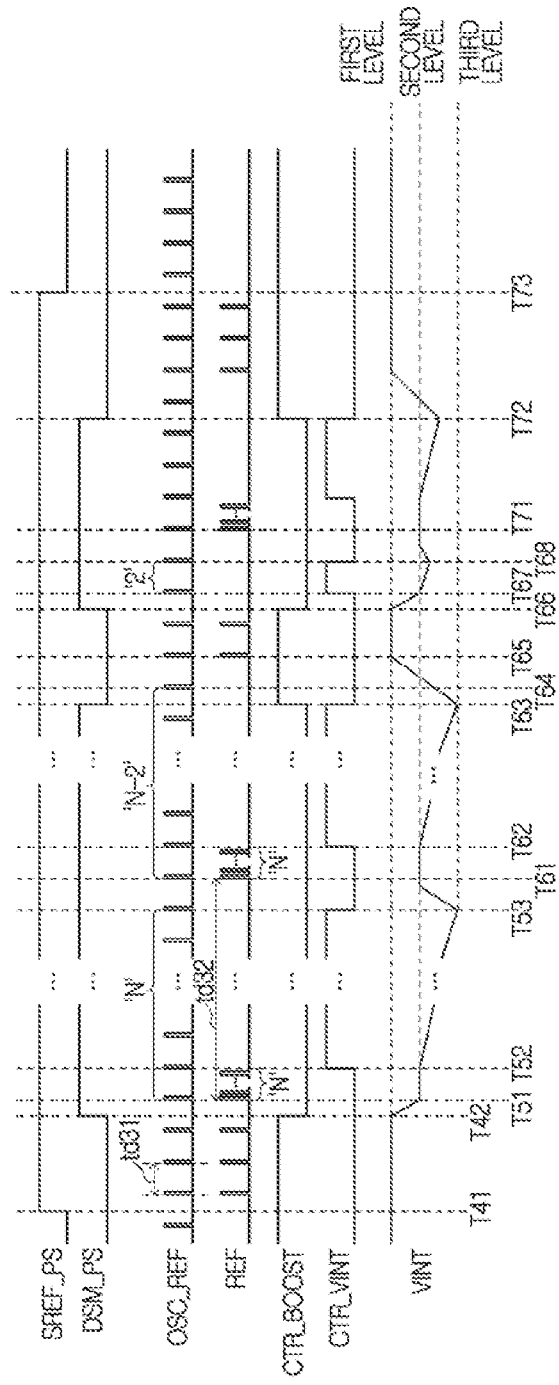
FIG. 24 is a timing diagram for describing an operation of adjusting a level of an internal voltage when the electronic device illustrated in FIG. 18 performs a self-refresh operation.

FIG. 24 is a timing diagram for describing an operation of adjusting, by the electronic device 420 illustrated in FIG. 18, the level of the internal voltage VINT when performing a self-refresh operation. Referring to FIG. 24, the period signal generation circuit 509 may generate the refresh cycle signal OSC_REF that is activated every refresh cycle "td31." A burst refresh cycle "td32" may be set as a multiple of "N" of the refresh cycle "td31." When an internal temperature of the electronic device 420 corresponds to a preset temperature section, the boost control signal generation circuit 515 may activate the boost control signal CTR_BOOST. The internal voltage generation circuit 517 may set the level of the internal voltage VINT to a first level ("FIRST LEVEL") based on the activated boost control signal CTR_BOOST.

At a point in time T41, the first period signal generation circuit 503 may activate the self-refresh period signal SREF_PS when a self-refresh operation is performed. The refresh control circuit 513 may generate the refresh signal REF that is activated every refresh cycle "td31" of the refresh cycle signal OSC_REF based on the activated self-refresh period signal SREF_PS.

At a point in time T42, the second period signal generation circuit 505 may activate the internal mode period signal DSM_PS when an internal mode is performed in the self-refresh operation. The boost control signal generation circuit 515 may deactivate the boost control signal CTR_BOOST based on the activated internal mode period signal DSM_PS. The internal voltage generation circuit 517 may adjust the level of the internal voltage VINT from the first level ("FIRST LEVEL") to a second level ("SECOND LEVEL") based on the deactivated boost control signal CTR_BOOST.

At a point in time T51, the internal mode control circuit 511 may activate the burst control signal CTR_BURST within one refresh cycle "td31" by counting the input of the refresh cycle signal OSC_REF. The refresh control circuit 513 may activate the refresh signal REF "N" times at set cycle intervals based on the activated burst control signal CTR_BURST.

From a point in time T52 to a point in time T53, the internal mode control circuit 511 may activate the blocking control signal CTR_BLOCK every refresh cycle "td31." The point in time T52 may be a point in time at which one refresh cycle "td31" in which the burst control signal CTR_BURST is activated has elapsed from the point in time T51. The point in time T53 may be a point in time, ahead of one refresh cycle "td31", earlier than a point in time at which the burst refresh cycle "td32" elapses from the point in time T51. The refresh control circuit 513 may block the generation of the refresh signal REF "N−1" times from the point in time T52 to the point in time T53 based on the activated blocking control signal CTR_BLOCK.

At the point in time T52, the internal mode control circuit 511 may activate the internal voltage control signal CTR_VINT. The internal voltage generation circuit 517 may adjust the level of the internal voltage VINT from the second level ("SECOND LEVEL") to a third level ("THIRD LEVEL") based on the activated internal voltage control signal CTR_VINT.

At the point in time T53, the internal mode control circuit 511 may deactivate the internal voltage control signal CTR_VINT. When the internal voltage control signal CTR_VINT is deactivated, the internal voltage generation circuit 517 may restore the level of the internal voltage VINT from the third level ("THIRD LEVEL") to the second level ("SECOND LEVEL").

At a point in time T61, the internal mode control circuit 511 may activate the burst control signal CTR_BURST again within one refresh cycle "td31." The point in time T61 may be a point in time at which the burst refresh cycle "td32" has elapsed from the point in time T51. The refresh control circuit 513 may activate the refresh signal REF "N" times at set cycle intervals based on the activated burst control signal CTR_BURST.

From a point in time T62 to a point in time T63, the internal mode control circuit 511 may activate the blocking control signal CTR_BLOCK every refresh cycle "td31." The point in time T62 may be a point in time at which one refresh cycle "td31" in which the burst control signal CTR_BURST is activated has elapsed from the point in time T61. The point in time T63 may be a point in time at which the internal mode period signal DSM_PS is deactivated. The refresh control circuit 513 may block the generation of the refresh signal REF "N−3" times from the point in time T62 to the point in time T63 based on the activated blocking control signal CTR_BLOCK.

At the point in time T62, the internal mode control circuit 511 may activate the internal voltage control signal CTR_VINT. The internal voltage generation circuit 517 may adjust the level of the internal voltage VINT from the second level ("SECOND LEVEL") to the third level ("THIRD LEVEL") based on the activated internal voltage control signal CTR_VINT.

At the point in time T63, the second period signal generation circuit 505 may deactivate the Internal mode period signal DSM_PS when the internal mode has ended in the self-refresh operation. The boost control signal generation circuit 515 may activate the boost control signal CTR_BOOST based on the deactivated internal mode period signal DSM_PS. The internal voltage generation circuit 517 may restore the level of the Internal voltage VINT from the third level ("THIRD LEVEL") to the first level ("FIRST LEVEL") based on the activated boost control signal CTR_BOOST.

At a point in time T64, the Internal mode control circuit 511 may activate the blocking control signal CTR_BLOCK when the internal mode has ended in the state in which the internal voltage control signal CTR_VINT has been activated. The refresh control circuit 513 may block the generation of the refresh cycle signal REF once at the point in time T64 based on the activated blocking control signal CTR_BLOCK.

At a point in time T65, the refresh control circuit 513 may generate the refresh signal REF that is activated every refresh cycle "td31" of the refresh cycle signal OSC_REF based on the activated self-refresh period signal SREF_PS.

At a point in time T66, the second period signal generation circuit 505 may activate the internal mode period signal DSM_PS again for the re-entry into an internal mode in the self-refresh operation. The boost control signal generation circuit 515 may deactivate the boost control signal CTR_BOOST based on the activated internal mode period signal DSM_PS. The internal voltage generation circuit 517 may adjust the level of the Internal voltage VINT from the first level ("FIRST LEVEL") to the second level ("SECOND LEVEL") based on the deactivated boost control signal CTR_BOOST.

From a point in time T67 to a point in time T68, the internal mode control circuit 511 may activate the blocking control signal CTR_BLOCK every refresh cycle by counting the input of the refresh cycle signal OSC_REF. The refresh control circuit 513 may block the generation of the refresh signal REF "2" times from the point in time T67 to the point in time T68 based on the activated blocking control signal CTR_BLOCK. The point in time T67 may be a point in time at which the refresh cycle signal OSC_REF is inputted for the first time after the internal mode is re-entered in the self-refresh operation. The point in time T68 is a point in time, ahead of one refresh cycle "td31", earlier than a point in time T71 when the burst control signal CTR_BURST is activated.

At the point in time T67, the internal mode control circuit 511 may activate the internal voltage control signal CTR_VINT. The internal voltage generation circuit 517 may adjust the level of the internal voltage VINT from the second level ("SECOND LEVEL") to the third level ("THIRD LEVEL") based on the activated internal voltage control signal CTR_VINT.

At the point in time T68, the internal mode control circuit 511 may deactivate the internal voltage control signal CTR_VINT. When the internal voltage control signal CTR_VINT is deactivated, the internal voltage generation circuit 517 may restore the level of the internal voltage VINT from the third level ("THIRD LEVEL") to the second level ("SECOND LEVEL").

At a point in time T71, the internal mode control circuit 511 may activate the burst control signal CTR_BURST within one refresh cycle "td31" by counting the input of the refresh cycle signal OSC_REF.

At a point in time T72, the second period signal generation circuit 505 may deactivate the internal mode period signal DSM_PS when the internal mode has ended in the self-refresh operation.

At a point in time T73, the first period signal generation circuit 503 may deactivate the self-refresh period signal SREF_PS when the self-refresh operation has ended.

As described above, the electronic device 420 according to the present disclosure can reduce power consumption during a period, in which an internal mode is performed, by lowering the level of the internal voltage set to be high in order to stably perform a normal operation during the period in which the internal mode is performed in a self-refresh operation. Furthermore, the electronic device 420 according to the present disclosure can stably perform a refresh operation in an internal mode and also reduce standby power by determining whether to perform continuous refresh operations and whether to adjust the level of the internal voltage every refresh cycle, when performing an internal mode in a self-refresh operation.

What is claimed is:

1. An electronic device comprising:
   an internal mode control circuit suitable for generating a burst control signal, a blocking control signal, and an internal voltage control signal based on a refresh cycle when an internal mode is performed in a self-refresh operation;
   a refresh control circuit suitable for generating a refresh signal for performing a refresh operation every refresh cycle when the self-refresh operation is performed, generating the refresh signal every set cycle based on the burst control signal when the internal mode is performed, and blocking the generation of the refresh signal based on the blocking control signal; and
   an internal voltage generation circuit suitable for adjusting a level of an internal voltage for the refresh operation based on the internal voltage control signal,
   wherein, when the internal mode is performed, the internal mode control circuit activates the burst control signal within at least one refresh cycle whenever a burst refresh cycle elapses,
   wherein the burst refresh cycle is set larger than the refresh cycle,
   wherein, when the internal mode is performed, the internal mode control circuit counts an input of a refresh cycle signal and sets the burst refresh cycle in which the burst control signal is generated whenever the input of the refresh cycle signal is counted multiple times, and
   wherein the refresh cycle signal is activated every refresh cycle.

2. The electronic device of claim 1, wherein, when an internal temperature corresponds to a preset temperature section in the internal mode, the internal mode control circuit controls an activation state of each of the burst control signal, the blocking control signal, and the internal voltage control signal every refresh cycle.

3. The electronic device of claim 1,
wherein the burst refresh cycle is set as a multiple of "N" of the refresh cycle, and
wherein the "N" is set as a natural number equal to or greater than 3.

4. The electronic device of claim 1,
wherein, when the internal mode is performed, the internal mode control circuit counts an input of a set cycle signal "N" times every burst refresh cycle and activates the burst control signal whenever the input of the set cycle signal is counted, and
wherein the set cycle signal is activated every set cycle.

5. The electronic device of claim 3, wherein, when the burst refresh cycle elapses in the internal mode, the internal mode control circuit activates the blocking control signal every refresh cycle until a next burst refresh cycle elapses from a point in time at which the at least one refresh cycle in which the burst control signal is activated has elapsed.

6. The electronic device of claim 3, wherein, when the burst refresh cycle elapses in the internal mode, the internal mode control circuit:
activates the internal voltage control signal from a point in time at which the at least one refresh cycle in which the burst control signal is activated has elapsed, and
deactivates the internal voltage control signal, ahead of at least one refresh cycle, earlier than a point in time at which a next burst refresh cycle elapses.

7. The electronic device of claim 1, wherein the internal mode control circuit deactivates the internal voltage control signal when the internal mode has ended in the self-refresh operation.

8. The electronic device of claim 1, wherein the internal mode control circuit activates the blocking control signal at least once when the internal mode has ended in a state in which the internal voltage control signal has been activated.

9. The electronic device of claim 1, wherein the internal mode control circuit comprises:
a count circuit suitable for generating a count signal by counting inputs of one of a set cycle signal that is activated every set cycle and a refresh cycle signal that is activated every refresh cycle based on an up-down control signal in the internal mode; and
an operation control signal generation circuit suitable for generating the up-down control signal, the burst control signal, the blocking control signal, and the internal voltage control signal based on a combination of the count signals.

10. The electronic device of claim 9,
wherein the count circuit increases a value corresponding to the combination of the count signals by counting the inputs of the set cycle signal when the up-down control signal has a first logic level in the internal mode, and
wherein the operation control signal generation circuit sets a logic level of the up-down control signal as the first logic level when the combination of the count signals corresponds to an initial value and generates the burst control signal according to the combination of the count signals when the up-down control signal has the first logic level.

11. The electronic device of claim 10,
wherein the count circuit decreases the value corresponding to the combination of the count signals by counting an input of the refresh cycle signal when the up-down control signal has a second logic level, and
wherein the operation control signal generation circuit sets a logic level of the up-down control signal as the second logic level when the combination of the count signals corresponds to "N" in the internal mode and generates the blocking control signal and the internal voltage control signal according to the combination of the count signals when the up-down control signal has the second logic level.

12. The electronic device of claim 1, wherein the refresh control circuit comprises:
an internal refresh signal generation circuit suitable for generating an internal refresh signal from one of a set cycle signal that is activated every set cycle and a refresh cycle signal that is activated every refresh cycle, based on the burst control signal; and
a refresh signal generation circuit suitable for blocking the generation of the refresh signal from the internal refresh signal based on the blocking control signal,
wherein the set cycle is set to be shorter than the refresh cycle.

13. The electronic device of claim 1, wherein the internal voltage generation circuit:
lowers a level of the internal voltage when the internal voltage control signal is activated, and
raises a level of the internal voltage when a boost control signal is activated,
wherein the boost control signal is deactivated during a period in which the internal mode is performed.

14. An electronic device comprising:
an internal mode control circuit suitable for generating an internal voltage control signal based on a refresh cycle when an internal mode is performed in a self-refresh operation;
a boost control signal generation circuit suitable for generating a boost control signal depending on whether the internal mode is performed in the self-refresh operation; and
an internal voltage generation circuit suitable for adjusting a level of an internal voltage for a refresh operation based on the internal voltage control signal and the boost control signal,
wherein, when the internal mode is performed, the internal mode control circuit activates a burst control signal within at least one refresh cycle whenever a burst refresh cycle elapses,
wherein the burst refresh cycle is set larger than the refresh cycle,
wherein, when the internal mode is performed, the internal mode control circuit counts an input of a refresh cycle signal and sets the burst refresh cycle in which the burst control signal is generated whenever the input of the refresh cycle signal is counted multiple times, and
wherein the refresh cycle signal is activated every refresh cycle.

15. The electronic device of claim 14, wherein, when an internal temperature corresponds to a preset temperature section in the internal mode, the internal mode control circuit controls an activation state of the internal voltage control signal every refresh cycle.

16. The electronic device of claim 14, wherein the internal mode control circuit:
controls the refresh operation to be performed at set cycle intervals within at least one refresh cycle whenever a burst refresh cycle elapses in the internal mode, and
activates the internal voltage control signal from a point in time at which the at least one refresh cycle elapses when the burst refresh cycle elapses, wherein the burst refresh cycle is set as a multiple of "N" of the refresh cycle, and wherein the set cycle is set to be shorter than the refresh cycle.

17. The electronic device of claim 16, wherein, when the burst refresh cycle elapses in the internal mode, the internal mode control circuit deactivates the internal voltage control signal, ahead of the at least one refresh cycle, earlier than a point in time at which a next burst refresh cycle elapses.

18. The electronic device of claim 14, wherein, when an internal temperature corresponds to a preset temperature section, the boost control signal generation circuit activates the boost control signal and deactivates the boost control signal during a period in which the internal mode is performed in the self-refresh operation.

19. The electronic device of claim 14, wherein the internal voltage generation circuit:
   lowers the level of the internal voltage when the internal voltage control signal is activated, and
   raises the level of the internal voltage when the boost control signal is activated.

* * * * *